(12) United States Patent
Yasuda

(10) Patent No.: US 9,887,384 B2
(45) Date of Patent: Feb. 6, 2018

(54) METHOD FOR PRODUCING FLEXIBLE DISPLAY DEVICE, AND FLEXIBLE DISPLAY DEVICE

(71) Applicant: Sharp Kabushiki Kaisha, Osaka-shi, Osaka (JP)

(72) Inventor: Yuki Yasuda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 145 days.

(21) Appl. No.: 14/903,068

(22) PCT Filed: Jul. 7, 2014

(86) PCT No.: PCT/JP2014/068009
§ 371 (c)(1),
(2) Date: Jan. 6, 2016

(87) PCT Pub. No.: WO2015/008642
PCT Pub. Date: Jan. 22, 2015

(65) Prior Publication Data
US 2016/0164030 A1 Jun. 9, 2016

(30) Foreign Application Priority Data
Jul. 16, 2013 (JP) .................................. 2013-148002

(51) Int. Cl.
*G02F 1/1341* (2006.01)
*G02F 1/1339* (2006.01)
(Continued)

(52) U.S. Cl.
CPC ...... *H01L 51/5253* (2013.01); *G02F 1/13439* (2013.01); *G02F 1/13458* (2013.01);
(Continued)

(58) Field of Classification Search
CPC . H01L 51/56; H01L 51/003; H01L 2251/566;
H01L 51/524–51/5256;
(Continued)

(56) References Cited

U.S. PATENT DOCUMENTS 9,601,715 B2 * 3/2017 Odaka ................. H01L 51/5246
9,698,387 B2 * 7/2017 Popp .................... H01L 51/0014
(Continued)

FOREIGN PATENT DOCUMENTS

JP 2002-151254 A 5/2002
JP 2004-214281 A 7/2004
(Continued)

OTHER PUBLICATIONS

Official Communication issued in International Patent Application No. PCT/JP2014/068009, dated Oct. 7, 2014.

*Primary Examiner* — Mariceli Santiago
(74) *Attorney, Agent, or Firm* — Keating & Bennett, LLP

(57) ABSTRACT

The method is for producing a flexible display device, the flexible display device including a first flexible base material and a second flexible base material which are attached to each other by a first adhesive layer, the method including the following steps (1) to (4) in the order given: (1) forming a conductive line and terminals; (2) forming a removal layer to directly cover the terminals; (3) sequentially arranging multiple layers including the first adhesive layer and the second flexible base material, with higher interfacial adhesions present between the removal layer and the second flexible base material than the interfacial adhesion between the removal layer and the terminals; and (4) exposing the terminals.

12 Claims, 24 Drawing Sheets

(51) Int. Cl.
*H01L 51/56* (2006.01)
*H01L 51/52* (2006.01)
*H01L 51/00* (2006.01)
*G02F 1/1345* (2006.01)
*G02F 1/1343* (2006.01)
*H01L 27/32* (2006.01)
*G02F 1/1333* (2006.01)

(52) U.S. Cl.
CPC .... *G02F 1/133305* (2013.01); *H01L 27/3276* (2013.01); *H01L 51/003* (2013.01); *H01L 51/0097* (2013.01); *H01L 51/5246* (2013.01); *H01L 51/56* (2013.01); *G02F 2001/133302* (2013.01); *G02F 2202/28* (2013.01); *H01L 27/329* (2013.01); *H01L 51/524* (2013.01); *H01L 2227/323* (2013.01); *H01L 2227/326* (2013.01); *H01L 2251/5338* (2013.01); *Y02E 10/549* (2013.01); *Y02P 70/521* (2015.11)

(58) Field of Classification Search
CPC ... G02F 1/1345–1/13458; H05B 33/04; H05B 33/10
See application file for complete search history.

(56) References Cited

U.S. PATENT DOCUMENTS

| | | | |
|---|---|---|---|
| 2001/0040645 A1* | 11/2001 | Yamazaki | G02F 1/133305 349/42 |
| 2003/0184704 A1* | 10/2003 | Akiyama | G02F 1/133305 349/158 |
| 2004/0129960 A1 | 7/2004 | Maruyama et al. | |
| 2008/0309650 A1* | 12/2008 | Nishikawa | H01L 27/3276 345/206 |
| 2010/0248402 A1 | 9/2010 | Maruyama et al. | |
| 2013/0029447 A1 | 1/2013 | Maruyama et al. | |
| 2014/0203415 A1 | 7/2014 | Maruyama et al. | |
| 2017/0077401 A1* | 3/2017 | Kawanago | H01L 51/003 |

FOREIGN PATENT DOCUMENTS

| | | | | |
|---|---|---|---|---|
| JP | 2009-205941 A | | 9/2009 | |
| JP | 2012003988 A | * | 1/2012 | |
| JP | 2016208020 A | * | 12/2016 | ........ H01L 27/3276 |

* cited by examiner (D)

(E)

(D)

(E)

Fig. 13-1
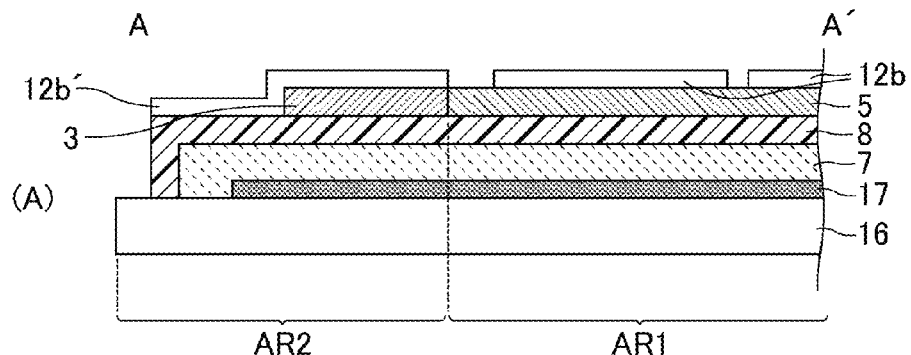
(A)
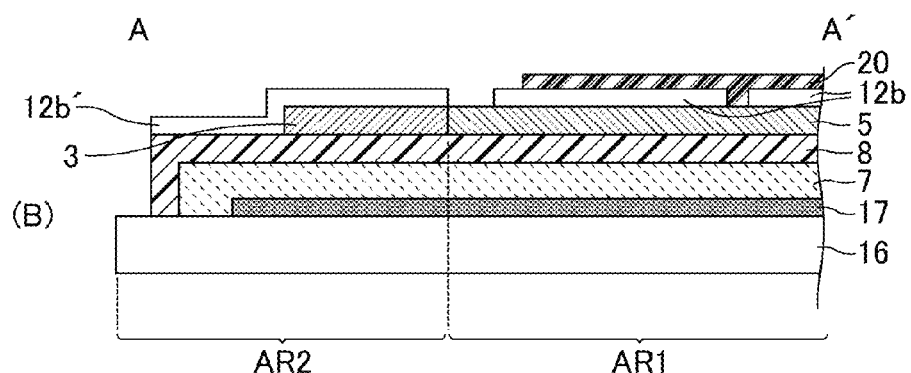
(B)
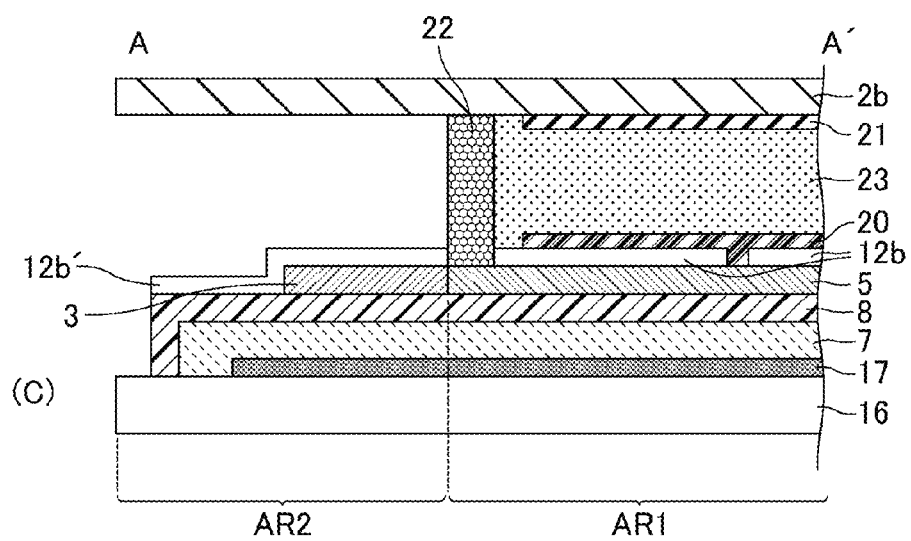
(C)

(D)

(E)

METHOD FOR PRODUCING FLEXIBLE DISPLAY DEVICE, AND FLEXIBLE DISPLAY DEVICE

TECHNICAL FIELD

The present invention relates to a method for producing a flexible display device, and to a flexible display device. More specifically, the present invention relates to a method for producing a flexible display device provided with a display element such as an organic electroluminescent element or a liquid crystal layer; and a flexible display device.

BACKGROUND ART

Flat display devices such as liquid crystal display devices and organic electroluminescent display devices have rapidly become popular. In order to further improve the marketability of these flat display devices, next-generation display devices provided with new functions have been developed. One of the next-generation display devices is a bendable flexible display device.

Production of a flexible display device requires formation of elements such as thin-film transistors on a flexible substrate. A known method for such formation of elements is transfer of thin-film transistors formed on a glass substrate in advance onto a flexible substrate (e.g. Patent Literatures 1 and 2). For the transfer in Patent Literature 2, terminals to be connected to external terminals are uncovered by removing predetermined portions of a layer on the terminals by etching.

CITATION LIST

Patent Literature

Patent Literature 1: JP 2004-214281 A
Patent Literature 2: JP 2009-205941 A

SUMMARY OF INVENTION

Technical Problem

In production of a flexible display device, some methods of uncovering terminals damage the terminals, degrading the properties of a display element. For example, the invention described in Patent Literature 2 exposes terminals by etching a glass substrate as illustrated in FIG. 9 of Patent Literature 2 with hydrofluoric acid, and removing the protective film by reactive ion etching. However, in the case of wet etching with hydrofluoric acid, the wet etching is usually followed by a washing step through which the flexible substrate as illustrated in FIG. 9 of Patent Literature 2 and a sealing material may fail to prevent entry of moisture. This is considered to cause a problem of degradation in the properties of an organic electroluminescent element.

As described above, in the case of a flexible display device provided with an organic electroluminescent element, the properties of the organic electroluminescent element may be degraded when the terminals are uncovered by removing by a method such as wet etching a sealing flexible base material or an adhesive layer that are disposed on the terminals. This is because organic electroluminescent elements are vulnerable to moisture and oxygen. Also in the case of forming a sealing film to cover an organic electroluminescent element, the sealing film cannot sufficiently prevent entry of moisture and the like due to the method such as wet etching.

Meanwhile, it is also possible in a method for producing a flexible display device to selectively attach a sealing flexible base material and an adhesive layer to portions other than the top of the terminals (portions covering the terminals) in order to eliminate the uncovering step for the terminals. In this case, however, there is no component (e.g. a sealing flexible material and an adhesive layer) supporting the terminals in separation of the glass substrate before attachment of a flexible base material to the sealing flexible base material, which may cause damages such as tears and creases on the terminals in separation of the glass substrate.

The present invention was made in view of the above state of the art, and aims to provide a method for producing a flexible display device, the method being capable of uncovering terminals without damaging the terminals and of sufficiently preventing degradation of the properties of a display element; and a flexible display device producible by the above method for producing a flexible display device.

Solution to Problem

The present inventor has made various studies on methods for producing a flexible display device, which can uncover terminals without damaging the terminals and sufficiently prevent degradation of the properties of a display element. As a result, the inventor focused on formation of a removal layer having a low interfacial adhesion with the terminals in advance on the terminals. The present inventor has found that the terminals can be uncovered, without being damaged, by designing the removal layer and the terminals to have the lowest interfacial adhesion among the interfacial adhesions present between the removal layer and the opposite-side flexible base material where no terminals are provided; cutting the layer on the removal layer from the opposite-side flexible base material side; making a cut in the removal layer to a depth not deeper than the interface with the terminals; separating the cut removal layer; and removing the cut layer on the removal layer and the cut removal layer. Also, since the terminals are uncovered by not a wet method such as wet etching but a dry method, the properties of the display element were found to be sufficiently prevented from being degraded. The present inventor found that the process can solve the above problems, and thereby made the present invention.

That is, a first aspect of the present invention may be a method for producing a flexible display device, the flexible display device including a first flexible base material and a second flexible base material which are attached to each other by a first adhesive layer, the method including the following steps (1) to (4) in the order given:

(1) forming a conductive line in a display region on a main surface of the first flexible base material or of a temporary supporting substrate, and forming terminals that are led out from the conductive line into an edge region on the main surface;

(2) forming a removal layer to directly cover the terminals;

(3) sequentially arranging multiple layers including the first adhesive layer and the second flexible base material in the display region and in the edge region, with higher interfacial adhesions present between the removal layer and the second flexible base material than the interfacial adhesion between the removal layer and the terminals; and (4) exposing at least part of each terminal by cutting the multiple layers and making a cut in the removal layer to a depth not deeper than the interface with the terminals in the display region side of the edge region, and separating the part of the cut removal layer on the side opposite to the display region to remove the parts of the cut multiple layers and removal layer on the side opposite to the display region.

A second aspect of the present invention may be a flexible display device, including;
a first flexible base material;
a conductive line and a display element placed in a display region on a main surface of the first flexible base material;
terminals that are arranged in an edge region on the main surface of the first flexible base material and are led out from the conductive line;
a first adhesive layer placed at least in the display region; and
a second flexible base material attached to at least the display region by the first adhesive layer,
the terminals each being partly covered with the removal layer on the display region side,
the interfacial adhesion between the removal layer and the terminals being the lowest among the interfacial adhesions present between the removal layer and the second flexible base material.

The flexible display device of the second aspect of the present invention can be produced by the method for producing a flexible display device of the first aspect of the present invention.

Advantageous Effects of Invention

The present invention can provide a method for producing a flexible display device, the method capable of uncovering terminals without damaging the terminals and of sufficiently preventing degradation of the properties of a display element; and a flexible display device suitably producible by the above method for producing a flexible display device.

BRIEF DESCRIPTION OF DRAWINGS

FIG. 4-1 illustrates schematic views of cross sections taken along the A-A' line in FIG. 1, showing the production flow of the flexible display device of Embodiment 1 (steps A to D).

FIG. 4-2 illustrates other schematic views of cross sections taken along the A-A' line in FIG. 1, showing the production flow of the flexible display device of Embodiment 1 (steps E and F).

FIG. 4-3 illustrates other schematic views of cross sections taken along the A-A' line in FIG. 1, showing the production flow of the flexible display device of Embodiment 1 (steps G and H).

FIG. 4-4 illustrates other schematic views of cross sections taken along the A-A' line in FIG. 1, showing the production flow of the flexible display device of Embodiment 1 (steps I and J).

FIG. 4-5 illustrates another schematic view of a cross section taken along the A-A' line in FIG. 1, showing the production flow of the flexible display device of Embodiment 1 (step K).

FIG. 5 is a schematic cross-sectional view illustrating a cross section of a flexible display device of any of Embodiments 2 and 3 taken along the A-A' line in FIG. 1.

FIG. 6-1 illustrates schematic views of cross sections taken along the A-A' line in FIG. 1, showing the production flow of the flexible display device of Embodiment 2 (steps A to D).

FIG. 6-2 illustrates other schematic views of cross sections taken along the A-A' line in FIG. 1, showing the production flow of the flexible display device of Embodiment 2 (steps E and F).

FIG. 6-3 illustrates another schematic view of a cross section taken along the A-A' line in FIG. 1, showing the production flow of the flexible display device of Embodiment 2 (step G).

FIG. 9-1 illustrates schematic views of cross sections taken along the A-A' line in FIG. 1, showing the production flow of the flexible display device of Embodiment 4 (steps A to C).

FIG. 9-2 illustrates other schematic views of cross sections taken along the A-A' line in FIG. 1, showing the production flow of the flexible display device of Embodiment 4 (steps D and E).

FIG. 9-3 illustrates other schematic views of cross sections taken along the A-A' line in FIG. 1, showing the production flow of the flexible display device of Embodiment 4 (steps F and G).

FIG. 9-4 illustrates another schematic view of a cross section taken along the A-A' line in FIG. 1, showing the production flow of the flexible display device of Embodiment 4 (step H).

FIG. 11-1 illustrates schematic views of cross sections taken along the A-A' line in FIG. 1, showing the production flow of the flexible display device of Embodiment 5 (steps A to C).

FIG. 11-2 illustrates other schematic views of cross sections taken along the A-A' line in FIG. 1, showing the production flow of the flexible display device of Embodiment 5 (steps D and E).

FIG. 11-3 illustrates other schematic views of cross sections taken along the A-A' line in FIG. 1, showing the production flow of the flexible display device of Embodiment 5 (steps F and G).

FIG. 11-4 illustrates another schematic view of a cross section taken along the A-A' line in FIG. 1, showing the production flow of the flexible display device of Embodiment 5 (step H).

FIG. 13-1 illustrates schematic views of cross sections taken along the A-A' line in FIG. 1, showing the production flow of the flexible display device of Embodiment 6 (steps A to C).

FIG. 13-2 illustrates other schematic views of cross sections taken along the A-A' line in FIG. 1, showing the production flow of the flexible display device of Embodiment 6 (steps D and E).

FIG. 13-3 illustrates other schematic views of cross sections taken along the A-A' line in FIG. 1, showing the production flow of the flexible display device of Embodiment 6 (steps F and G).

FIG. 13-4 illustrates another schematic view of a cross section taken along the A-A' line in FIG. 1, showing the production flow of the flexible display device of Embodiment 6 (step H).

DESCRIPTION OF EMBODIMENTS

The present invention will be described in more detail below with reference to the drawings based on embodiments which, however, are not intended to limit the scope of the present invention. The following embodiments may be appropriately combined or changed without departing from the spirit of the present invention. Herein, the main surface of the first flexible base material or of the temporary supporting substrate refers to the second flexible base material side surface of the first flexible base material or of the temporary supporting substrate. Also, the main surface of the second flexible base material refers to the first flexible base material side or temporary supporting substrate side surface of the second flexible base material.

Embodiment 1

In Embodiment 1, a sealing film formed on the organic electroluminescent element is also formed on terminals, and is used as a removal layer. Also, a flexible display device is produced by a process of forming components such as an organic electroluminescent element on the main surface of a glass substrate, and separating the glass substrate to replace the glass substrate with a flexible base material.

Figure 1:
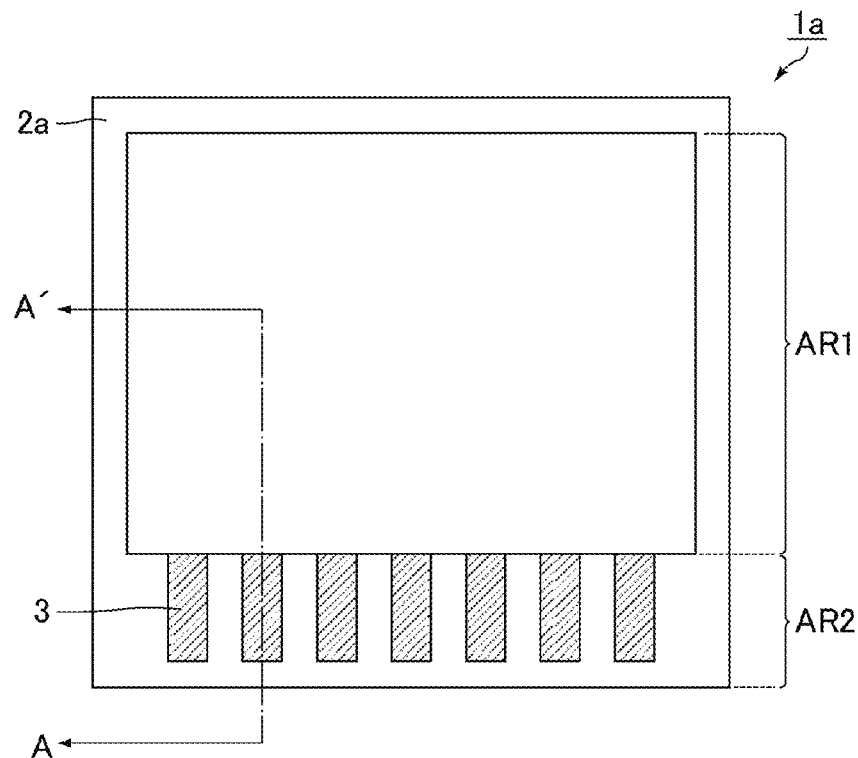
FIG. 1 is a schematic plan view of a flexible display device of any one of Embodiments 1 to 6.
Figure 2:
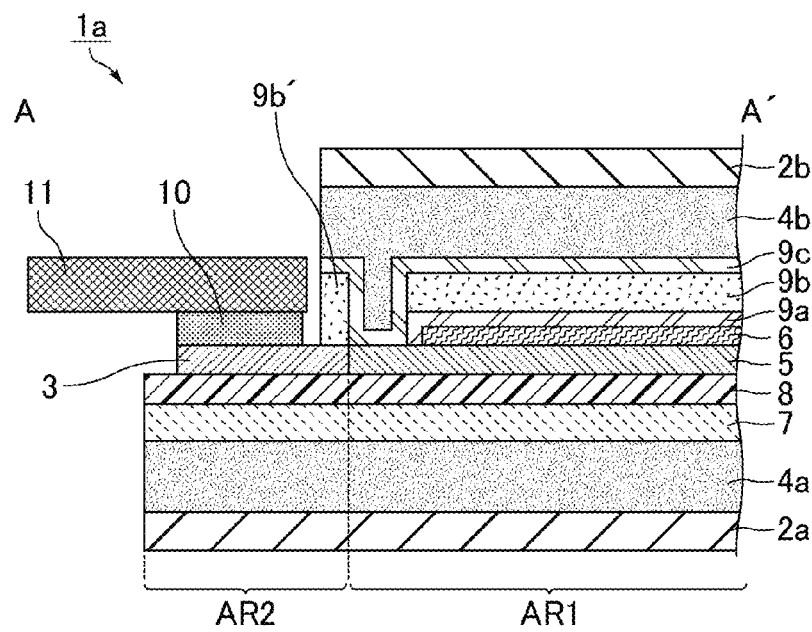
FIG. 2 is a schematic cross-sectional view illustrating a cross section of the flexible display device of Embodiment 1 taken along the A-A' line in FIG. 1.

FIG. 1 is a schematic plan view of a flexible display device of Embodiment 1. FIG. 2 is a schematic cross-sectional view illustrating a cross section of the flexible display device of Embodiment 1 taken along the A-A' line in FIG. 1. As illustrated in FIG. 1 and FIG. 2, a flexible display device 1a of Embodiment 1 includes a conductive line 5 and an organic electroluminescent element 6 that are placed in a display region AR1 on the main surface of a flexible base material 2a (first flexible base material), and terminals 3 that are led out from the conductive line 5 into an edge region AR2 on the main surface of the flexible base material 2a. To the flexible base material 2a is attached a flexible base material 2b (second flexible base material) by an adhesive layer 4b (first adhesive layer).

On the main surface of the flexible base material 2a, an adhesive layer 4a (second adhesive layer), a polyimide layer 7, and a protective film 8 are laminated in the order given. The conductive line 5 in the display region AR1 and each terminal 3 in the edge region AR2 are provided on the protective film 8. Also, the organic electroluminescent element 6 is provided on the conductive line 5. The display region AR1 further includes sealing films 9a, 9b, and 9c that cover the organic electroluminescent element 6. The edge region AR2 also includes a sealing film 9b' and the sealing film 9c on the terminal 3 in the vicinity of the display region AR1. In the edge region AR2 where the terminal 3 is exposed, a flexible printed circuit board 11 is laminated with an anisotropic conductive film 10 in between.

Figure 3:
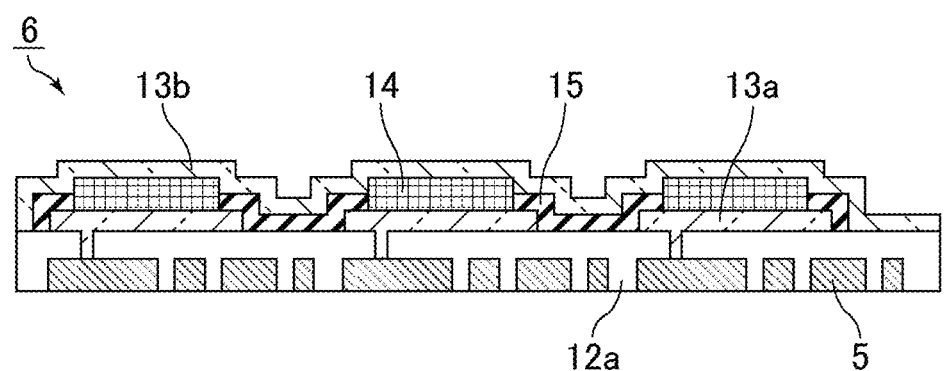
FIG. 3 is a schematic cross-sectional view of an organic electroluminescent element.

The organic electroluminescent element 6 is described with reference to FIG. 3. FIG. 3 is a schematic cross-sectional view of an organic electroluminescent element. As illustrated in FIG. 3, the organic electroluminescent element 6 includes electrodes 13a (first electrodes), organic electroluminescent layers 14, and an electrode 13b (second electrode). The electrodes 13a are electrically connected to the conductive lines 5 through openings provided in an insulating film 12a that covers the conductive lines 5. Edge covers 15 are formed to surround the organic electroluminescent layers 14 on the electrodes 13a and to cover the ends of the electrodes 13a. The electrode 13b covers the organic electroluminescent layers 14 and the edge covers 15.

The flexible display device 1a of Embodiment 1 is a bottom emission type display device in which light is emitted from the conductive line 5 side in the case where the electrodes 13a are light-transmissive or light-translucent electrodes and the electrode 13b is a light-reflective electrode. The flexible display device 1a of Embodiment 1 is a top emission type display device in which light is emitted from the sealing film 9a side in the case where the electrodes 13a are light-reflective electrodes and the electrode 13b is a light-transmissive or light-translucent electrode. Hereinafter, a top emission type display device is described.

Figures 1, 4:
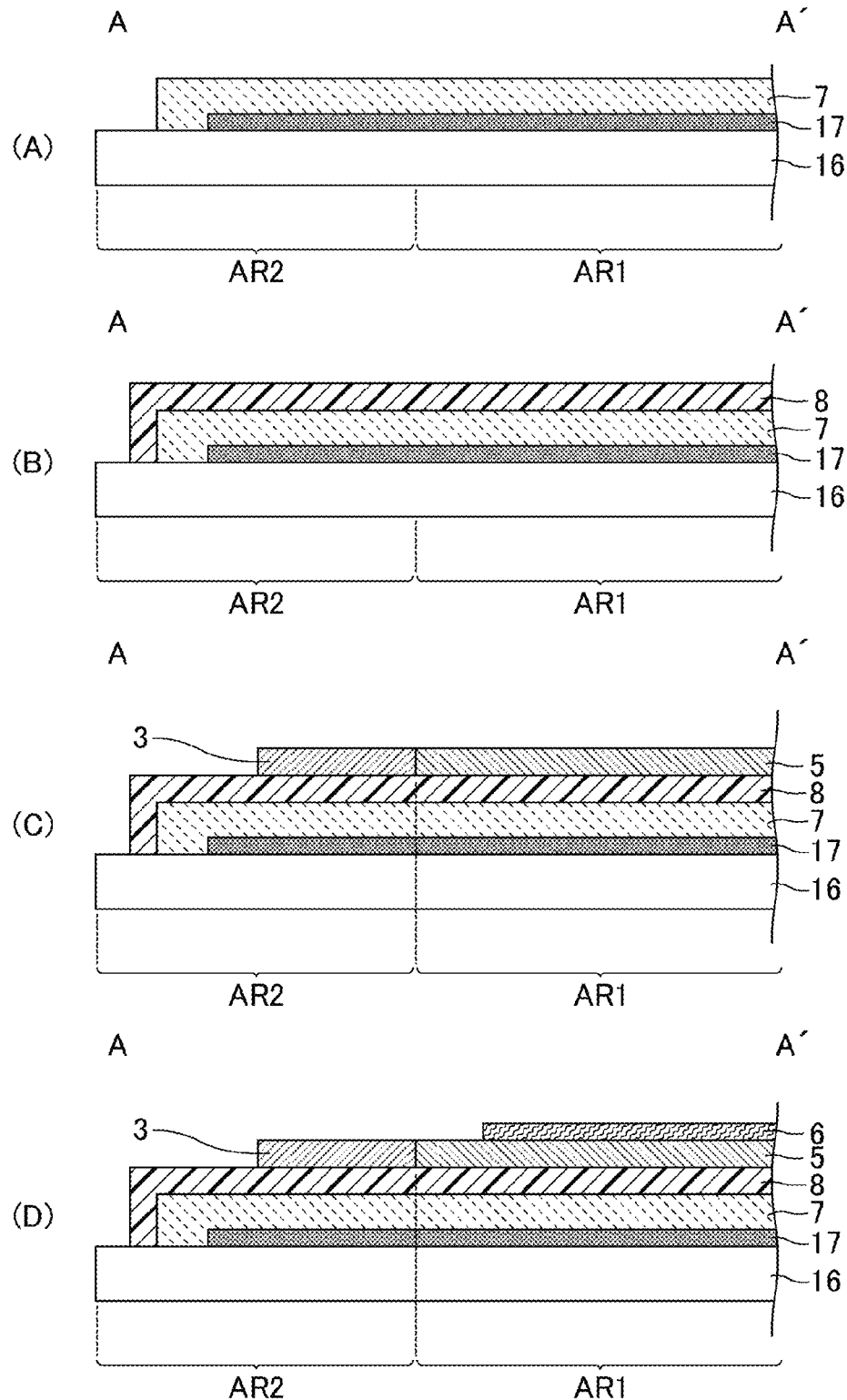
Figure 4:
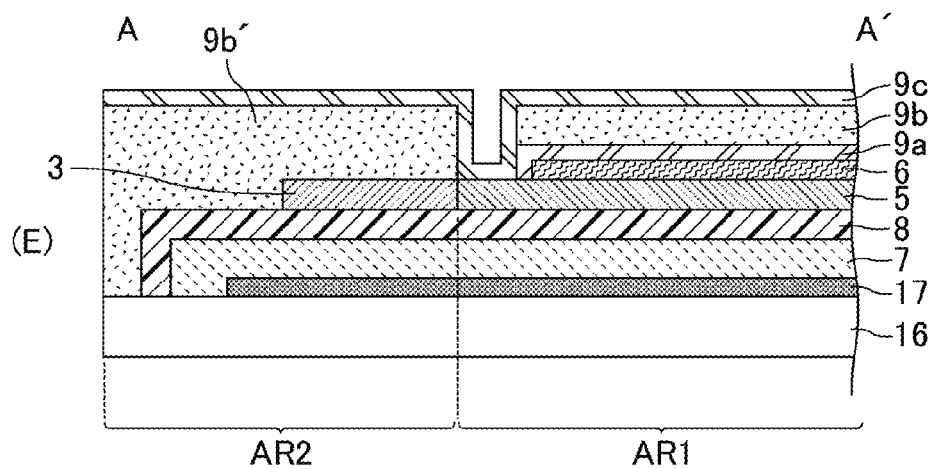
Figure 2:
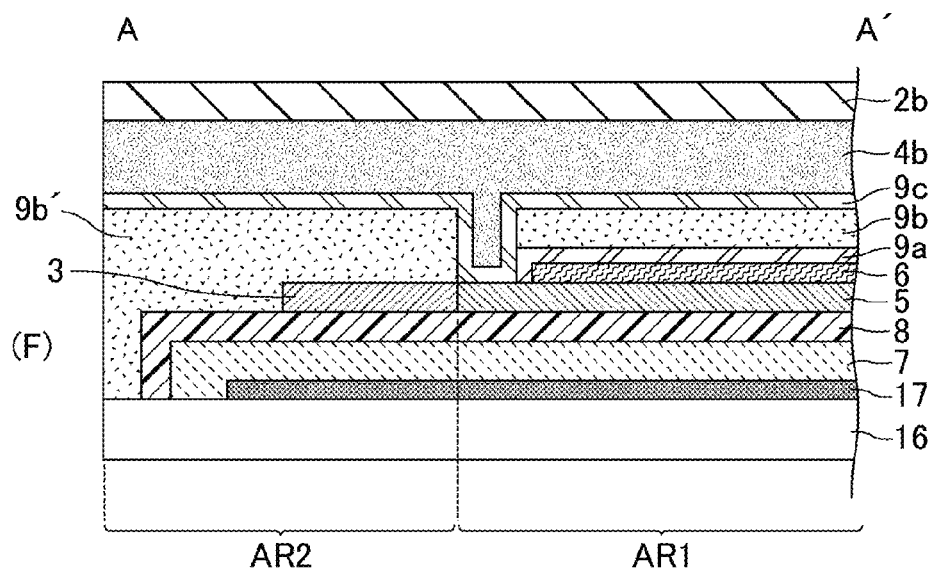
Figure 4:
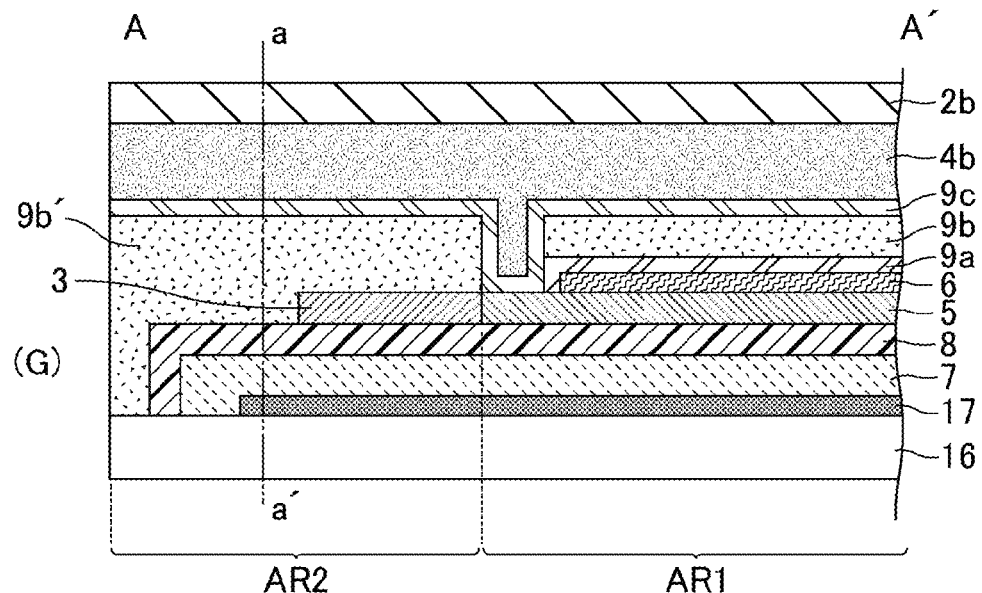
Figure 3:
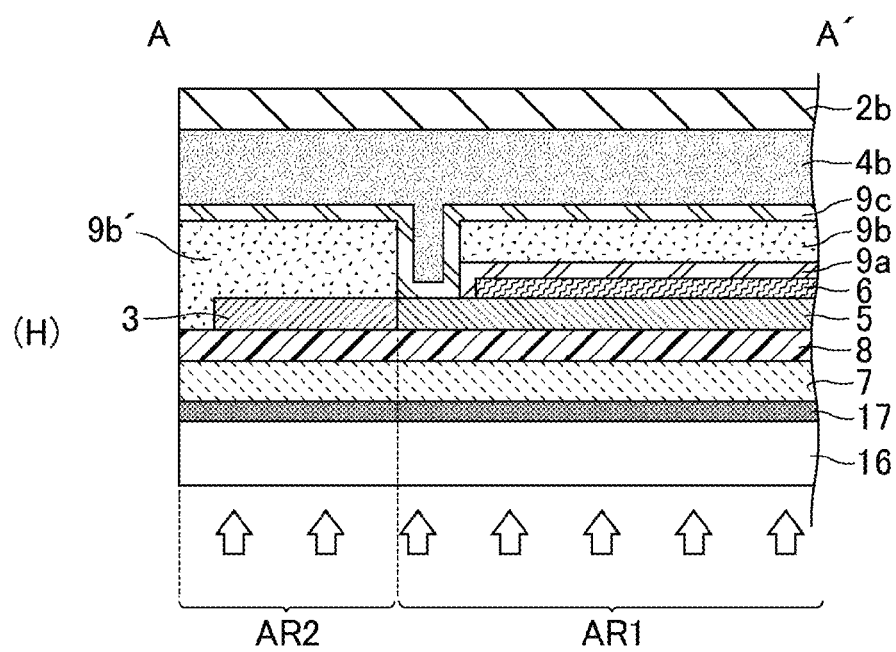
Figure 4:
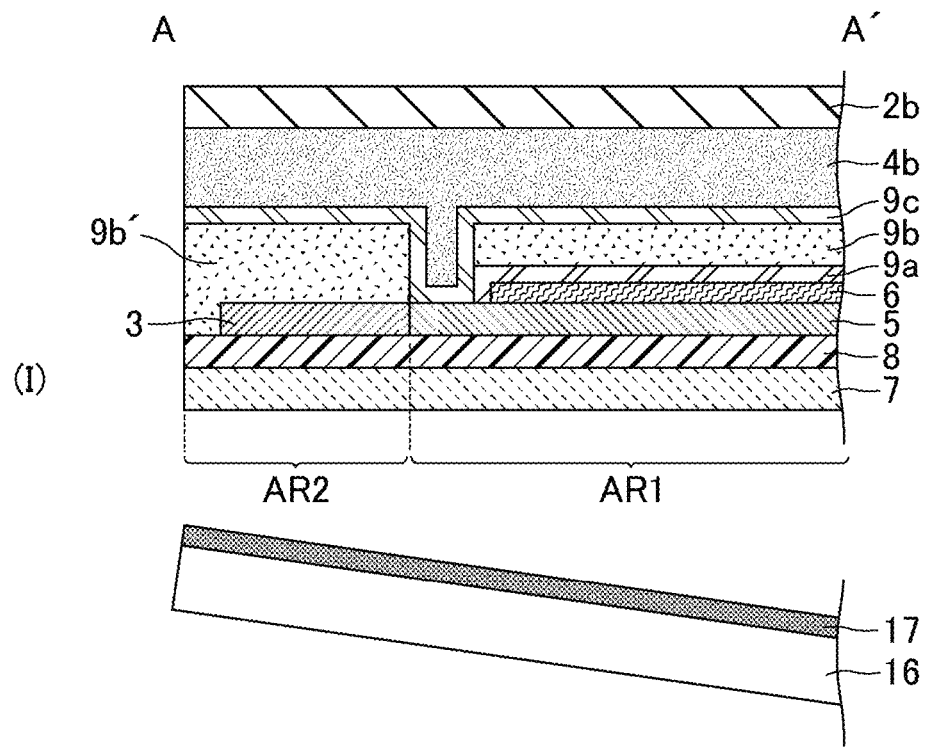
Figure 4:
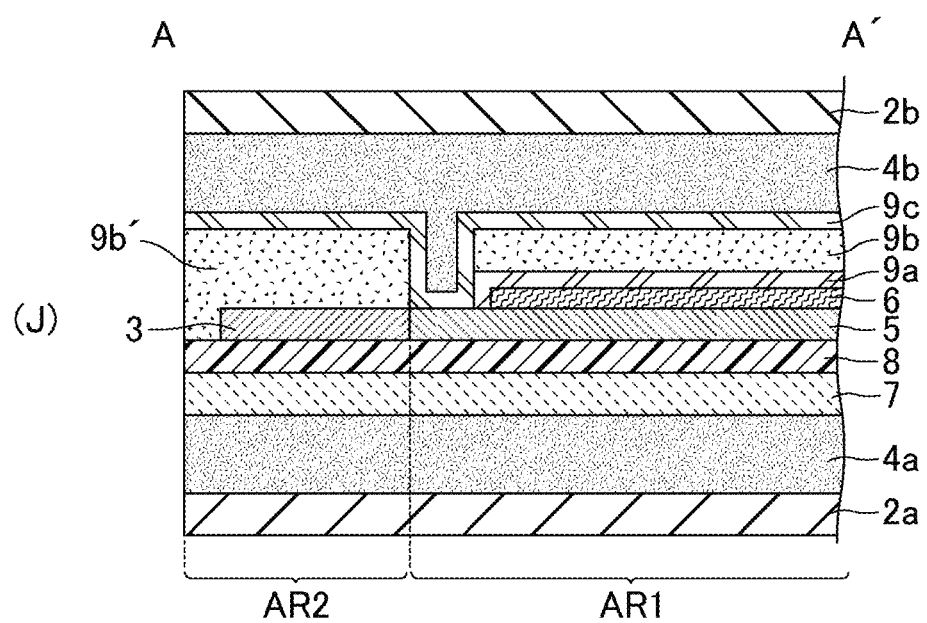
Figures 4, 5:
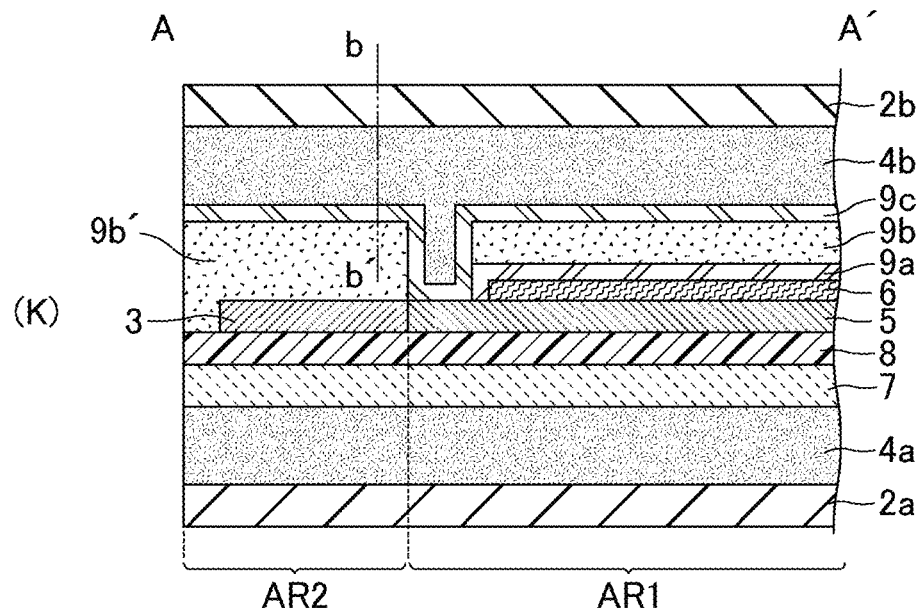
Figure 5:
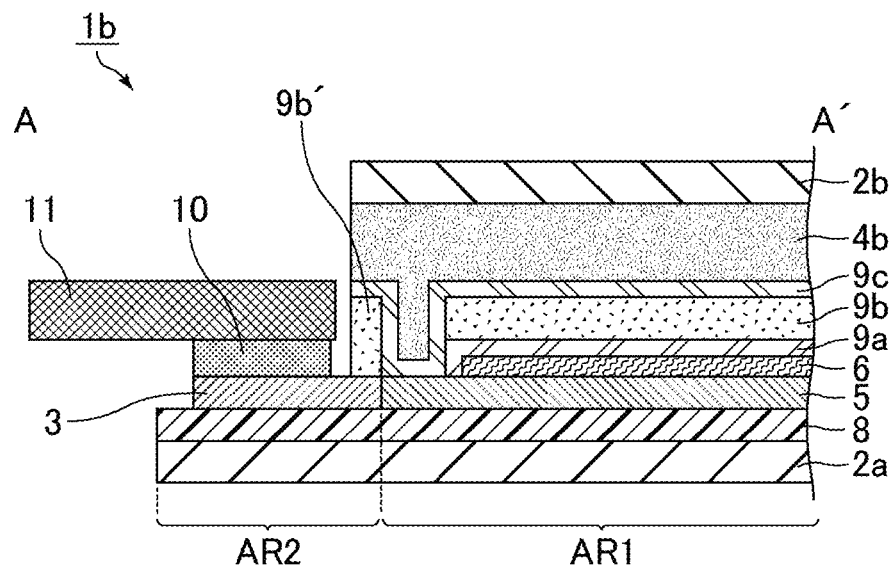

Next, the method for producing the flexible display device of Embodiment 1 is described with reference to FIGS. 4-1 to 4-5. FIGS. 4-1 to 4-5 illustrate schematic views of cross sections taken along the A-A' line in FIG. 1, showing the production flow of the flexible display device of Embodiment 1.

(A) Formation of Heat-Absorbing Layer and Polyimide Layer

As illustrated in step (A) of FIG. 4-1, a heat-absorbing layer 17 is formed on the main surface of a glass substrate 16, which is a temporary supporting substrate, in the display region AR1 and the edge region AR2. The heat-absorbing layer 17 is, for example, a molybdenum (Mo) film having a thickness of 10 nm to 50 nm formed by sputtering. The heat-absorbing layer 17 is then covered with a film of a polyimide precursor by spin coating, slit coating, or screen printing, for example.

The surface of the heat-absorbing layer 17 (Mo film) may be treated before formation of the film of a polyimide precursor, for improvement in the wettability and the adhesion. The surface treatment may be performed by a dry method or a wet method. Examples of the dry surface treatment include reduced-pressure plasma treatment, ordinary-pressure plasma treatment, and ultra-violet (UV) treatment. Examples of the wet surface treatment include applying a surface treatment agent to the glass substrate 16. The surface treatment agent may be, for example, a coupling agent such as a silane coupling agent, an aluminum-based coupling agent, or a titanate-based coupling agent. In particular, a silane coupling agent is preferred.

The film of a polyimide precursor is baked such that a polyimide layer 7 is formed. The baking temperature is preferably higher than the treatment temperature for forming components such as the conductive line 5 and the terminal 3 in the later step. The baking temperature is 350° C. to 500° C., for example. Raising the baking temperature enables prevention of display defects and property degradation of the flexible display device which are due to gases generated from the polyimide layer 7.

The polyimide layer 7 preferably has a thickness of 5 μm to 50 μm. It may be difficult for the polyimide layer 7 having a thickness of smaller than 5 μm to exhibit the mechanical strength. The polyimide layer 7 having a thickness of greater than 50 μm may peel off and fail to stably form a laminate.

(B) Formation of Protective Film

As illustrated in step (B) of FIG. 4-1, a protective film 8 is formed to cover the polyimide layer 7. The protective film 8 is formed to prevent entry of external substances such as moisture from the glass substrate 16 side because an electroluminescent element 6 to be produced in the later step is vulnerable to moisture and oxygen.

The material of the protective film 8 can be, for example, an oxide or nitride of an element with high moisture resistance, such as silicon (Si) or aluminum (Al). Examples of the oxide include silicon dioxide ($SiO_2$) and aluminum oxide ($Al_2O_3$). Examples of the nitride include silicon nitride (SiNx) and silicon carbide nitride (SiCN). Examples of the method for forming the protective film 8 include plasma chemical vapor deposition (CVD), thermal CVD, and sputtering. In order to improve the moisture resistance, the protective film 8 may be a laminate.

(C) Formation of Conductive Line and Terminal

As illustrated in step (C) of FIG. 4-1, the conductive line 5 is formed on the protective film 8 in the display region AR1, and the terminal 3 from the conductive line 5 is led out onto the protective film 8 in the edge region AR2. Here, the conductive line 5 and the terminal 3 may be formed together with the components constituting thin-film transistor elements.

In the case of providing thin-film transistor elements, the material of the semiconductor layer in each thin-film transistor element may be, for example, low-temperature polysilicon or an oxide semiconductor. In particular, a compound (In—Ga—Zn—O) consisting of indium (In), gallium (Ga), zinc (Zn), and oxygen (O), which is an oxide semiconductor, is suitable. This is because the treatment temperature of oxide semiconductors is usually about 400° C. which is lower than the treatment temperature of low-temperature polysilicon (usually about 600° C.) and can be lower than the heatproof temperature (usually about 500° C.) of the polyimide layer 7 formed before the semiconductor layer.

(D) Formation of Organic Electroluminescent Element

As illustrated in step (D) of FIG. 4-1, the organic electroluminescent element 6 is formed on the conductive line 5. The organic electroluminescent element 6 is obtained by sequentially forming components including the electrodes 13*a*, the organic electroluminescent layers 14, and the electrode 13*b*, as illustrated in FIG. 3.

The electrodes 13*a* may be formed from a conductive, light-reflective metal, such as aluminum (Al), by a method such as vacuum deposition. The electrode 13*b* may be formed from a conductive, light-transmissive compound, such as indium tin oxide (ITO), by a method such as sputtering. Also, the colorization may be performed by RGB separate coating, which separately applies the colors of red (R), green (G), and blue (B), or a method using a white light-emitting layer and a color filter layer in combination.

(E) Formation of Sealing Film

As illustrated in step (E) of FIG. 4-2, the sealing film 9*a* is formed to cover the organic electroluminescent element 6 in the display region AR1. A sealing film 9*b* is then formed on the sealing film 9*a* in the display region AR1, and a sealing film 9*b*' serving as a removal layer is formed to cover the terminal 3 and part of the protective film 8 in the edge region AR2. A sealing film 9*c* is then formed to cover the sealing film 9*b* and part of the conductive line 5 in the display region AR1 and to cover the sealing film 9*b*' in the edge region AR2. Here, the sealing film is a film formed to cover organic electroluminescent elements in order to protect the organic electroluminescent elements from substances such as moisture.

The sealing films 9*a* and 9*c* are inorganic films, and the sealing films 9*b* and 9*b*' are organic films having the same composition. The structures of the sealing films are not limited to the above structures, and may each be a single-layer structure consisting of an inorganic film, a multi-layer structure in which inorganic films are laminated, or a multi-layer structure in which inorganic film(s) and organic film(s) are laminated. The material of the inorganic films may be, for example, an oxide or nitride of an element such as silicon (Si) or aluminum (Al), which are highly resistant to moisture. Examples of the oxide include silicon dioxide ($SiO_2$) and aluminum oxide ($Al_2O_3$). Examples of the nitride include silicon nitride (SiNx) and silicon carbide nitride (SiCN). Examples of the method for forming the inorganic films include plasma CVD, thermal CVD, vacuum deposition, and sputtering. The material of the organic films may be, for example, acrylate, polyurea, parylene, polyimide, or polyamide. Examples of the method for forming the organic films include vacuum deposition. A sealing film having the multi-layer structure in which inorganic films are laminated may be, for example, a SiNx/SiCN/SiNx film. A sealing film having the multi-layer structure in which inorganic film(s) and organic film(s) are laminated may be, for example, a SiNx/acrylate/SiNx film.

In the case of forming a sealing film having the multi-layer structure in which inorganic film(s) and organic film(s) are laminated, the ends of the organic film (sealing film 9*b*) having low moisture resistance are preferably covered with an inorganic film (sealing film 9*c*) having high moisture resistance, as illustrated in step (E) of FIG. 4-2. Here, in the structure illustrated in step (E) of FIG. 4-2, the organic film (sealing film 9*b*) serves to fill pinholes in the inorganic film (sealing film 9*a*) and to cover foreign substances entered before and during formation of the organic film (sealing film 9*b*). The thickness of the organic film (sealing film 9*b*) is therefore preferably 3 μm to 5 μm. A thickness of about 5 μm enables the organic film to cover normal pinholes and foreign substances.

The sealing film 9*b*' is formed to facilitate uncovering of terminals in the later step. In the case where the sealing film 9*b*' is an organic film, the interfacial adhesion between the sealing film 9*b*' and the terminal 3 is lower than the interfacial adhesion between a flexible base material 2*b* and an adhesive layer 4*b* which are to be placed in the later step, the interfacial adhesion between the adhesive layer 4*b* and the sealing film 9*c*, and the interfacial adhesion between the sealing film 9*c* and the sealing film 9*b*'. In the case where the sealing film 9*b*' is an inorganic film, using SiCN as the lower layer decreases the adhesion as described above. Usually, organic films have lower adhesion than inorganic films, but the adhesion of inorganic films is adjustable according to the film formation conditions.

The sealing films 9*a*, 9*b*, 9*b*', and 9*c* are formed by forming the sealing film 9*a* (first layer) using a mask, simultaneously forming the sealing films 9*b* and 9*b*' (second layer) using the same mask to transfer the separate pattern as illustrated in step (E) of FIG. 4-2, and forming the sealing film 9*c* (third layer) to cover the sealing film 9*b*. This method eliminates the need for using an additional mask for forming only the sealing film 9*b*'. The sealing films 9*b* and 9*b*' (second layer) are in a separate pattern as illustrated in step (E) of FIG. 4-2 for the following reason. That is, the sealing film (organic film), which is the second layer, if continuously formed on the entire surface, comes into contact with part of the conductive line 5 as well as each terminal 3. In this state, when the upper layer of each terminal 3 (the part covering the terminal 3) is separated for uncovering of terminals in the later step, the sealing film (organic film), which is the second layer, in contact with part of the conductive line 5 may also be separated to expose components other than the terminal 3 (e.g. the part of the conductive line 5). Also, since the upper layer of each terminal 3 is separated when the terminals are uncovered in the later step, the sealing film 9c may be formed to cover the sealing film 9b' in the edge region AR2, as illustrated in step (E) of FIG. 4-2.

From the viewpoint of sufficiently preventing degradation of the properties, the sealing films 9a, 9b, 9b', and 9c formed preferably do not significantly increase the temperature of the organic electroluminescent element. For example, the temperature of the organic electroluminescent layer 14 is preferably 100° C. or lower, more preferably 80° C. or lower. A temperature closer to room temperature is more preferred for the temperature of the organic electroluminescent layer 14. Still, since the moisture resistance of the sealing films 9a, 9b, 9b', and 9c is low when these films are inorganic films formed by CVD, the temperature and the degradation of the properties of the organic electroluminescent layer are in a trade-off relationship.

(F) Attachment of Second Flexible Base Material

As illustrated in step (F) of FIG. 4-2, the flexible base material 2b is attached by the adhesive layer 4b to the laminate to face the glass substrate 16. The attachment is preferably performed in vacuum in order to prevent generation of air bubbles. The flexible base material 2b is preferably a film made of a compound such as aramid, polyethylene terephthalate, polyethylene naphthalate, polycarbonate, polyetherimide, polyarylate, or polyimide. The adhesive layer 4b is, for example, a reaction-curable adhesive, a thermosetting adhesive, or an ultraviolet-curable adhesive.

In the case of forming a top-emission organic electroluminescent element 6, the flexible base material 2b is preferably transparent as well as being flexible. Specific examples thereof include transparent films and transparent plastic substrates.

The thickness of the flexible base material 2b is not particularly limited, but an excessively thin (e.g. 5 µm to 20 µm) flexible base material 2b may fail to support the other components when the glass substrate 16 is separated in the later step. This failure may lead to generation of creases after the separation of the glass substrate 16 due to the stress from components including the sealing films 9a, 9b, 9b', and 9c, the conductive line 5, the terminal 3, and the protective film 8. Hence, the thickness of the flexible base material 2b is preferably designed not to cause creases as described above. For example, the thickness is preferably 50 µm or greater. Also, a flexible display device utilizing a thin film can be produced and a thinner profile of the flexible display device can be achieved by, for example, employing a film obtained by attaching a film including a self-adsorption layer having a thickness of about 100 µm (e.g. polyethylene terephthalate) to a thin film having a thickness of about 5 µm, and separating the film including the self-adsorption layer after separation of the glass substrate 16 in the later step.

(G) Substrate Cutting after Attachment

The flexible base material 2b and the adhesive layer 4b are cut from the flexible base material 2b side and the remaining layers and the glass substrate 16 are cut from the glass substrate 16 side, along the line a-a' indicated in step (G) of FIG. 4-3. Here, the cutting position indicated by the line a-a' may be any other position that crosses the heat-absorbing layer 17 but not the conductive line 5 and the terminal 3, so that the position suits the method of separating the glass substrate 16 from the laminate in the interface between the heat-absorbing layer 17 and the polyimide layer 7, in the later step. The cutting method from the flexible base material 2b side is not particularly limited, and may be a method utilizing a laser, for example. Also, the cutting method from the glass substrate 16 side may be a method usually employed to cut a glass substrate, such as a method that forms a cut on the substrate with a diamond wheel or the like, and adding an external force to the cut part to cut through the substrate.

(H) Irradiation of Heat-Absorbing Layer with Laser Light

As indicated by the arrows illustrated in step (H) of FIG. 4-3, the laminate is irradiated with laser light from the cut glass substrate 16 side. Thereby, the heat-absorbing layer 17 absorbs heat to decrease the adhesion between the heat-absorbing layer 17 and the polyimide layer 7, so that the glass substrate 16 and the heat-absorbing layer 17 are separated together from the laminate in the interface between the heat-absorbing layer 17 and the polyimide layer 7. Here, the laser light may be ultraviolet light, and is preferably excimer laser light (e.g. wavelength: 308 nm). The properties of the thin-film transistor elements do not change before and after the laser irradiation.

(I) Separation of Glass Substrate

As illustrated in step (I) of FIG. 4-4, the glass substrate 16 and the heat-absorbing layer 17 are separated together from the laminate in the interface between the heat-absorbing layer 17 and the polyimide layer 7. Here, the separation method may be peeling by hand or by a device such as a drive roll or a robot.

When the heat-absorbing layer is irradiated with laser light, if the flexible base material 2b is not formed, components such as the sealing films 9a, 9b, 9b', and 9c, the conductive line 5, the terminal 3, and the protective film 8 are not supported, so that the stress from the components may cause creases after the separation of the glass substrate 16. Accordingly, when the glass substrate 16 is separated, the flexible base material 2b and the adhesive layer 4b are also formed as upper layers of the terminals 3 (parts covering the terminals 3). If the flexible base material 2b and the adhesive layer 4b are selectively attached to parts other than the terminals 3, creases may be caused by the separation of the glass substrate 16 as described above.

Although the present embodiment employs the method separating the glass substrate 16 from the laminate in the interface between the heat-absorbing layer 17 and the polyimide layer 7, the separation method disclosed in Patent Literature 1 may be used. That is, the method employed may include forming a metal film on the main surface of the glass substrate 16, forming an oxide layer containing the metal on the metal film, crystallizing the oxide layer by heating, and separating the glass substrate 16 from the laminate in the inside of the oxide layer or the interface between the oxide layer and the metal film.

(J) Attachment of First Flexible Base Material

As illustrated in step (J) of FIG. 4-4, the flexible base material 2a is attached by the adhesive layer 4a to the laminate to face the flexible base material 2b. The attachment is preferably performed in vacuum in order to prevent generation of air bubbles. The flexible base material 2a is preferably a film made of aramid, polyethylene terephthalate, polyethylene naphthalate, polycarbonate, polyetherimide, polyarylate, or polyimide. A transparent flexible base material such as a transparent plastic substrate may also be used. The adhesive layer 4a may be a reaction-curable adhesive, a thermosetting adhesive, or an ultraviolet-curable adhesive, for example. The flexible base material 2a and the adhesive layer 4a may respectively be made of the same material as the flexible base material 2b and the adhesive layer 4b in order to prevent the resulting flexible display device from being curved due to the stress or the like factors.

(K) Uncovering of Terminals

The flexible base material 2b, the adhesive layer 4b, and the sealing film 9c are cut from the flexible base material 2b side and a cut is made in the sealing film 9b', along the line b-b' illustrated in step (K) of FIG. 4-5. The suitable cutting method is laser irradiation. Here, the same laser as the laser used in the above-described cutting of the attached substrate can be used.

Next, the edge region AR2 side part of the cut sealing film 9b' is separated. The cut in the sealing film 9b' enables separation because, as described above, the interfacial adhesion between the sealing film 9b' and the terminals 3 is lower than the interfacial adhesion between the flexible base material 2b and the adhesive layer 4b, the interfacial adhesion between the adhesive layer 4b and the sealing film 9c, and the interfacial adhesion between the sealing film 9c and the sealing film 9b'.

The position of the end b' of the cutting position indicated by the line b-b' is in the edge region AR2 in the vicinity of the display region AR1 in the right-left direction of step (K) of FIG. 4-5, and is at the depth not deeper than the interface between the sealing film 9b' and the terminal 3 in the up-down direction of step (K) of FIG. 4-5. Here, the end b' of the cutting position is preferably at a position (depth) that is 50% to 90% of the thickness of the sealing film 9b' on the terminal 3. The greater the depth to which the sealing film 9b' is cut, the easier it is to separate the part of the cut sealing film 9b'. If the depth to which the sealing film 9b' is cut is less than 50% of the thickness of the sealing film 9b' on the terminal 3, it may be difficult to separate the sealing film 9b'. If the depth to which the sealing film 9b' is cut is more than 90% of the thickness of the sealing film 9b' on the terminal 3, the terminal 3 may be damaged during the cutting.

The edge region AR2 side parts of the cut flexible base material 2b, adhesive layer 4b, sealing film 9c, and sealing film 9b' are removed, so that the terminals 3 are exposed. Uncovering the terminals before the separation of the glass substrate 16 facilitates the later-described pressing of the flexible printed circuit board 11. However, if the heat-absorbing layer is irradiated with laser light as described above without components such as the flexible base material 2b and the adhesive layer 4b as upper layers of the terminals 3, creases may be caused by stress from the components such as the sealing films 9a, 9b, 9b', and 9c, the conductive lines 5, the terminals 3, and the protective film 8 after the glass substrate 16 is separated because the terminals 3 are not supported by the flexible base material 2b.

In this manner, the terminals 3 can be uncovered without being damaged. Also, since the terminals are uncovered by the dry method, degradation of the properties of the organic electroluminescent element 6 can be sufficiently prevented.

After the terminals 3 are uncovered as described above, the flexible printed circuit board 11 is pressed onto the exposed terminals 3 using the anisotropic conductive film 10. Thereby, the flexible display device 1a illustrated in FIG. 2 is completed.

Here, in the flexible display device 1a, the sealing film 9b' is left in the vicinity of the flexible printed circuit board 11 after the cutting in the above-described uncovering of the terminals. This remaining film shows that the device is produced by the production method of the present embodiment.

The reason that the sealing film 9b' is left is described below. In consideration of the blur amount (difference between the designed film width and the actual film width) in formation of the sealing film 9b' (organic film) using a mask, it is difficult to cut off the sealing film 9b' at the exact end of the sealing film 9b' to completely remove the cut sealing film 9b'. Usually, vapor deposition gives a great blur amount, and a CVD method gives a blur amount that is different depending on the chamber of the device. Hence, the thickness of the end of the sealing film 9b' may be different from the designed thickness. This means that in order to cut the sealing film 9b' at a position where the thickness is stable for an increase in the production efficiency, the conditions such as the cutting position need to be adjusted each time of cutting. Furthermore, in consideration of cutting precision of the cutting devices, it is difficult to cut the sealing film 9b' at the exact end of the sealing film 9b'. Therefore, the sealing film 9b' is left in the flexible display device 1a.

Embodiment 2

In Embodiment 2, the sealing film formed on the organic electroluminescent element is also formed on the terminals, and is used as a removal layer. Also, a flexible display device is produced by attaching a flexible base material to the main surface of the glass substrate, forming components such as an organic electroluminescent element, and separating the glass substrate.

The structure of the flexible display device of Embodiment 2 in a plan view is the same as that of Embodiment 1, and thus the schematic plan view thereof is as illustrated in FIG. 1. FIG. 5 is a schematic cross-sectional view illustrating a cross section of a flexible display device of Embodiment 2 taken along the A-A' line in FIG. 1. As illustrated in FIG. 5, a flexible display device 1b of Embodiment 2 is the same as the flexible display device 1a of Embodiment 1 except that the adhesive layer 4a and the polyimide layer 7 are not present between the flexible base material 2a and the protective film 8. As illustrated in FIG. 5, the protective film 8 is disposed on the main surface of the flexible base material 2a.

Figures 1, 6:
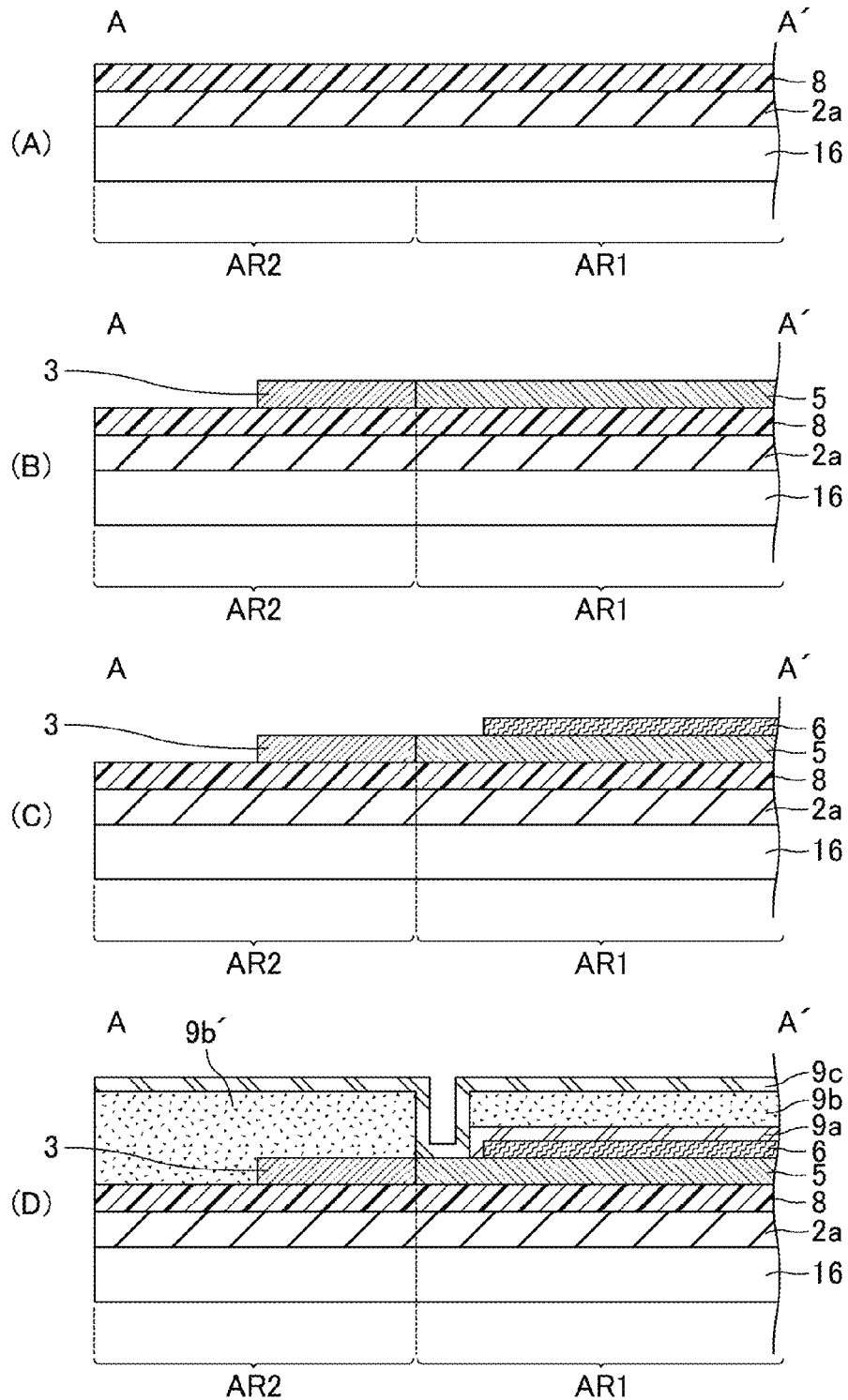
Figure 6:
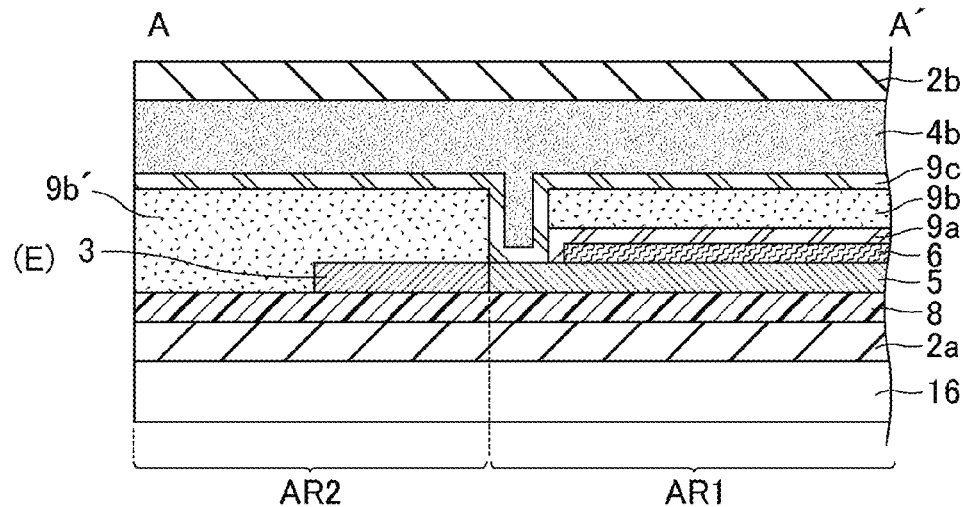
Figure 2:
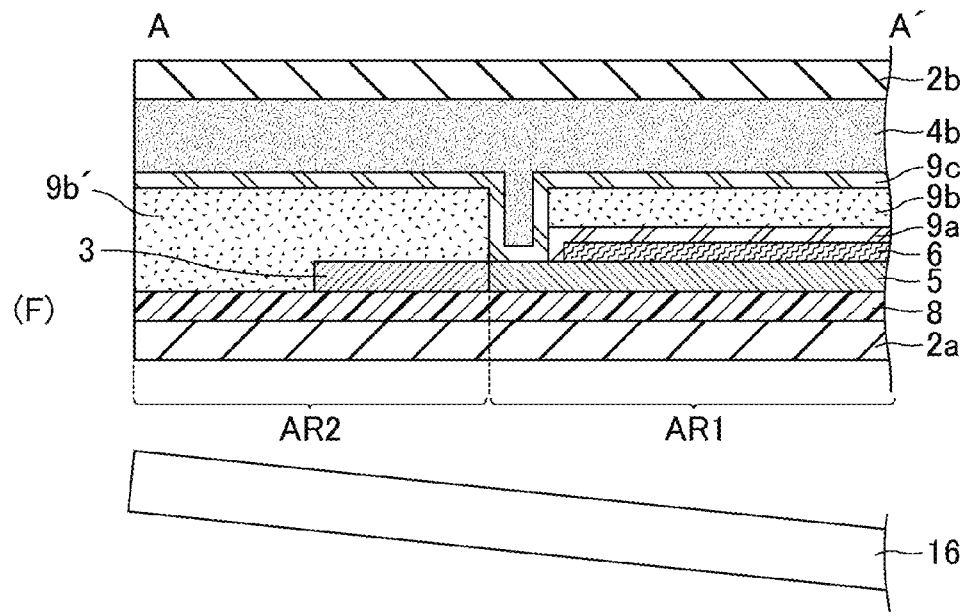
Figures 3, 6:
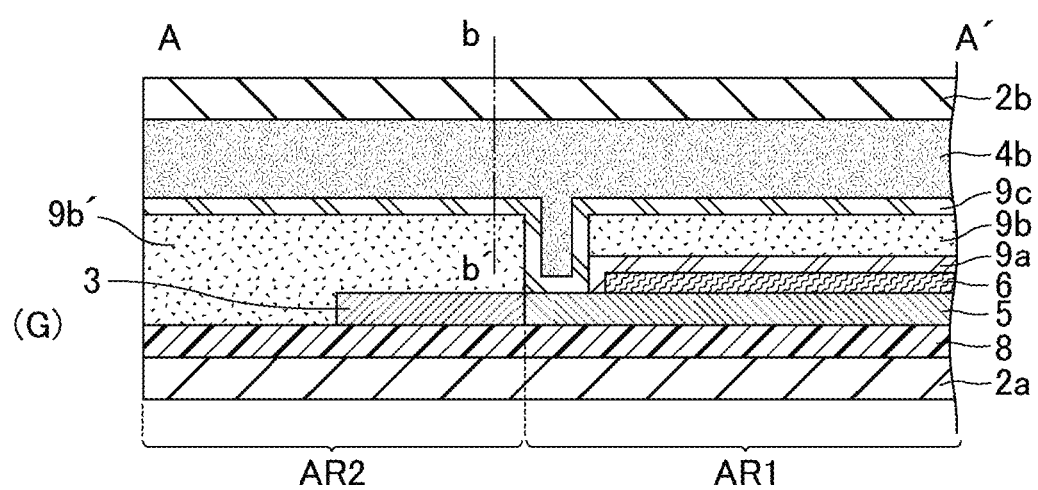

The method for producing a flexible display device of Embodiment 2 is described with reference to FIGS. 6-1 to 6-3. FIGS. 6-1 to 6-3 illustrate schematic views of cross sections taken along the A-A' line in FIG. 1, showing the production flow of the flexible display device of Embodiment 2.

The method for producing a flexible display device of Embodiment 2 is the same as the method for producing a flexible display device of Embodiment 1 except that the integrate of the glass substrate, the heat-absorbing layer, and the polyimide layer is replaced by a product obtained by attaching a flexible base material to the main surface of a glass substrate. Hence, the same points are not described below.

(A) Attachment of Flexible Base Material to Glass Substrate, and Formation of Protective Film As illustrated in step (A) of FIG. 6-1, the flexible base material 2a is attached to the main surface of the glass substrate 16, which is a temporary supporting substrate, using a component such as a resin removal layer which is separable in the later step. Known resin removal layers include UV-curable ones and thermosetting ones. The material of the resin removal layer may be, for example, acrylic resin, epoxy resin, or polyimide. In consideration of the heat resistance (about 400° C.) of the resin, the temperature during production of thin-film transistor elements needs to be low. Then, the protective film 8 is formed on the main surface of the flexible base material 2a in the display region AR1 and in the edge region AR2.

(B) Formation of Conductive Line and Terminal

As illustrated in step (B) of FIG. 6-1, the conductive line 5 is formed on the protective film 8 in the display region AR1, and the terminal 3 from the conductive line 5 is led out onto the protective film 8 in the edge region AR2.

(C) Formation of Organic Electroluminescent Element

As illustrated in step (C) of FIG. 6-1, the organic electroluminescent element 6 is formed on the conductive line 5.

(D) Formation of Sealing Film

As illustrated in step (D) of FIG. 6-1, the sealing film 9a is formed to cover the organic electroluminescent element 6 in the display region AR1. The sealing film 9b is then formed on the sealing film 9a in the display region AR1, and the sealing film 9b' (removal layer) is formed to cover the terminal 3 and part of the protective film 8 in the edge region AR2. The sealing film 9c is then formed to cover the sealing film 9b and part of the conductive line 5 in the display region AR1 and to cover the sealing film 9b' in the edge region AR2.

The sealing films 9a and 9c are inorganic films, and the sealing films 9b and 9b' are organic films having the same composition. The sealing film 9b' is formed to facilitate uncovering of terminals in the later step. In the case where the sealing film 9b' is an organic film, the interfacial adhesion between the sealing film 9b' and the terminal 3 is lower than the interfacial adhesion between the flexible base material 2b and the adhesive layer 4b which are to be placed in the later step, the interfacial adhesion between the adhesive layer 4b and the sealing film 9c, and the interfacial adhesion between the sealing film 9c and the sealing film 9b'. In the case where the sealing film 9b' is an inorganic film, using SiCN as the lower layer decreases the adhesion as described above. The sealing film 9b' may be an inorganic film that satisfies the relation among the adhesions as described above.

(E) Attachment of Second Flexible Base Material

As illustrated in step (E) of FIG. 6-2, the flexible base material 2b is attached by the adhesive layer 4b to the laminate to face the glass substrate 16.

(F) Separation of Glass Substrate

As illustrated in step (F) of FIG. 6-2, the glass substrate 16 is physically separated in the interface between the flexible base material 2a and the resin removal layer. The resin removal layer therefore remains on the glass substrate 16 side, and is no more on the flexible base material 2a side. Since the resin removal layer is used in Embodiment 2, a treatment such as laser irradiation (irradiation of the heat-absorbing layer with laser light) performed in Embodiment 1 is not necessary.

(G) Uncovering of Terminals

The flexible base material 2b, the adhesive layer 4b, and the sealing film 9c are cut from the flexible base material 2b side and a cut is made in the sealing film 9b', using laser, along the line b-b' illustrated in step (G) of FIG. 6-3.

Next, the edge region AR2 side part of the cut sealing film 9b' is separated. The cut in the sealing film 9b' enables separation because, as described above, the interfacial adhesion between the sealing film 9b' and the terminals 3 is lower than the interfacial adhesion between the flexible base material 2b and the adhesive layer 4b, the interfacial adhesion between the adhesive layer 4b and the sealing film 9c, and the interfacial adhesion between the sealing film 9c and the sealing film 9b'.

The position of the end b' of the cutting position indicated by the line b-b' is in the edge region AR2 in the vicinity of the display region AR1 in the right-left direction of step (G) of FIG. 6-3, and is at the depth not deeper than the interface between the sealing film 9b' and the terminal 3 in the up-down direction of step (G) of FIG. 6-3.

The edge region AR2 side parts of the cut flexible base material 2b, adhesive layer 4b, sealing film 9c, and sealing film 9b' are removed, so that the terminals 3 are exposed. Between the state illustrated in step (G) of FIG. 6-3 and the state illustrated in FIG. 5, parts of the flexible base material 2a and the protective film 8 in the edge region AR2 are cut by laser along a panel cutting line.

In this manner, the terminals 3 can be uncovered without being damaged. Also, since the terminals 3 are uncovered by the dry method, degradation of the properties of the organic electroluminescent element 6 can be sufficiently prevented.

After the terminals 3 are uncovered as described above, the flexible printed circuit board 11 is pressed onto the exposed terminals 3 using the anisotropic conductive film 10. Thereby, the flexible display device 1b illustrated in FIG. 5 is completed.

Here, in the flexible display device 1b, the sealing film 9b' is left in the vicinity of the flexible printed circuit board 11 after the cutting in the above-described uncovering of the terminals. This remaining film shows that the device is produced by the production method of the present embodiment.

The number of production steps in Embodiment 2 is less than the number of production steps in Embodiment 1, and the method for producing a flexible display device of Embodiment 2 can increase the production efficiency.

Embodiment 3

The method for producing a flexible display device of Embodiment 3 is the same as the method for producing a flexible display device of Embodiment 1 except that the integrate of the glass substrate, the heat-absorbing layer, and the polyimide layer is replaced by a flexible base material. Hence, the same points are not described below.

The structure of the flexible display device of Embodiment 3 in a plan view is the same as that of Embodiment 1, and thus the schematic plan view thereof is as illustrated in FIG. 1. Also, the structure of the flexible display device of Embodiment 3 in a cross-sectional view is the same as that of Embodiment 2, and thus the schematic cross-sectional view thereof is as illustrated in FIG. 5.

Figure 7:
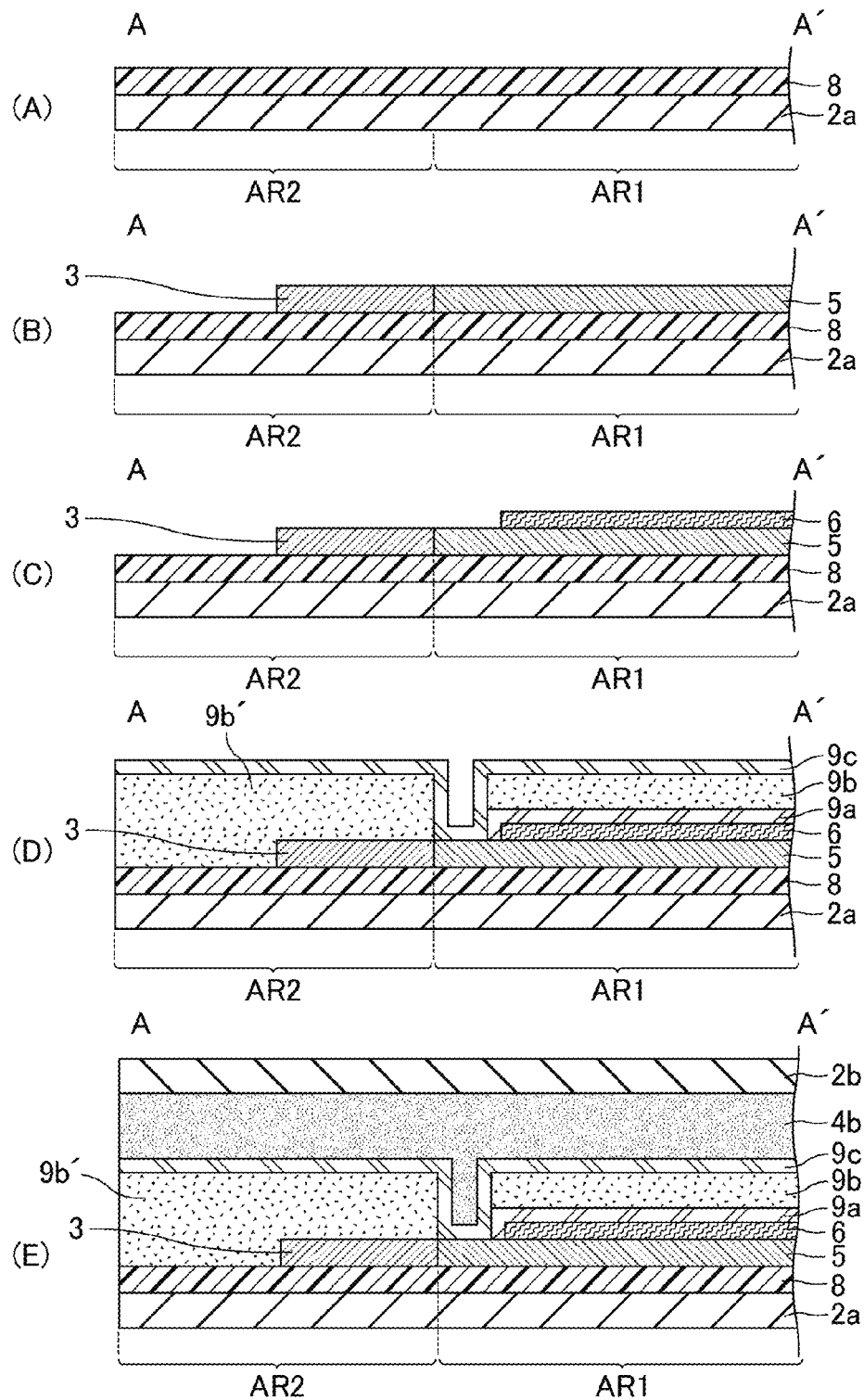
FIG. 7 illustrates schematic views of cross sections taken along the A-A' line in FIG. 1, showing the production flow of the flexible display device of Embodiment 3.

The method for producing a flexible display device of Embodiment 3 is described with reference to FIG. 7. FIG. 7 illustrates schematic views of cross sections taken along the A-A' line in FIG. 1, showing the production flow of the flexible display device of Embodiment 3.

(A) Formation of Protective Film

As illustrated in step (A) of FIG. 7, the protective film 8 is formed on the main surface of the flexible base material 2a in the display region AR1 and the edge region AR2.

(B) Formation of Conductive Line and Terminal

As illustrated in step (B) of FIG. 7, the conductive line 5 is formed on the protective film 8 in the display region AR1, and the terminal 3 from the conductive line 5 is led out onto the protective film 8 in the edge region AR2.

(C) Formation of Organic Electroluminescent Element

As illustrated in step (C) of FIG. 7, the organic electroluminescent element 6 is formed on the conductive line 5.

(D) Formation of Sealing Film

As illustrated in step (D) of FIG. 7, the sealing film 9a is formed to cover the organic electroluminescent element 6 in the display region AR1. The sealing film 9b is then formed on the sealing film 9a in the display region AR1, and the sealing film 9b' (removal layer) is formed to cover the terminal 3 and part of the protective film 8 in the edge region AR2. The sealing film 9c is then formed to cover the sealing film 9b and part of the conductive line 5 in the display region AR1 and to cover the sealing film 9b' in the edge region AR2.

The sealing films 9a and 9c are inorganic films, and the sealing films 9b and 9b' are organic films having the same composition. The sealing film 9b' is formed to enable suitable uncovering of terminals in the later step. In the case where the sealing film 9b' is an organic film, the interfacial adhesion between the sealing film 9b' and the terminal 3 is lower than the interfacial adhesion between the flexible base material 2b and the adhesive layer 4b which are to be placed in the later step, the interfacial adhesion between the adhesive layer 4b and the sealing film 9c, and the interfacial adhesion between the sealing film 9c and the sealing film 9b'. In the case where the sealing film 9b' is an inorganic film, using SiCN as the lower layer decreases the adhesion as described above.

(E) Attachment of Second Flexible Base Material

As illustrated in step (E) of FIG. 7, the flexible base material 2b is attached by the adhesive layer 4b to the laminate to face the flexible base material 2a.

(F) Uncovering of Terminals

Uncovering of the terminals in the present embodiment can be performed in the same manner as in Embodiment 2. In this manner, the terminals 3 can be uncovered without being damaged. Also, since the terminals 3 are uncovered by the dry method, degradation of the properties of the organic electroluminescent element 6 can be sufficiently prevented.

After the terminals 3 are uncovered as described above, the flexible printed circuit board 11 is pressed onto the exposed terminals 3 using the anisotropic conductive film 10. Thereby, the flexible display device 1b illustrated in FIG. 5 is completed.

The number of production steps in Embodiment 3 is less than the numbers of production steps in Embodiments 1 and 2, and the method for producing a flexible display device of Embodiment 3 can increase the production efficiency.

Embodiment 4

In Embodiment 4, the organic electroluminescent layer of the organic electroluminescent element is formed also on the terminals, and is used as removal layer. A flexible display device is produced by forming an organic electroluminescent element on the main surface of the glass substrate, and separating the glass substrate to replace the glass substrate with a flexible base material.

Figure 8:
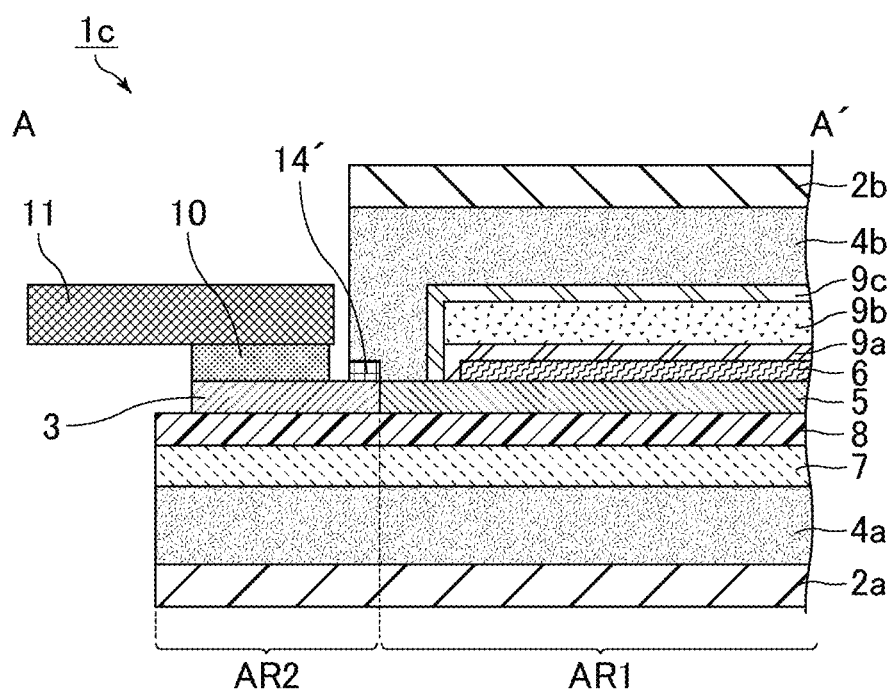
FIG. 8 is a schematic cross-sectional view illustrating a cross section of a flexible display device of Embodiment 4 taken along the A-A' line in FIG. 1.

The structure of the flexible display device of Embodiment 4 in a plan view is the same as that of Embodiment 1, and thus the schematic plan view thereof is as illustrated in FIG. 1. FIG. 8 is a schematic cross-sectional view illustrating a cross section of a flexible display device of Embodiment 4 taken along the A-A' line in FIG. 1. As illustrated in FIG. 8, a flexible display device 1c of Embodiment 4 is the same as the flexible display device 1a of Embodiment 1 except that the shape of the sealing film 9c is different and an organic electroluminescent layer 14' is used in place of the sealing film 9b'. Hence, the same points are not described below.

As illustrated in FIG. 8, the adhesive layer 4a, the polyimide layer 7, and the protective film 8 are sequentially laminated on the main surface of the flexible base material 2a. The conductive line 5 is formed on the protective film 8 in the display region AR1, and the terminal 3 from the conductive line 5 is led out onto the protective film 8 in the edge region AR2. On the conductive line 5 in the display region AR1, the organic electroluminescent element 6 including the organic electroluminescent layers 14, and the sealing films 9a, 9b, and 9c covering the organic electroluminescent element 6 are formed. Also in the edge region AR2, the organic electroluminescent layer 14' is laminated on the terminal 3 in the vicinity of the display region AR1. In a portion in which the terminal 3 is exposed, the flexible printed circuit board 11 is laminated with the anisotropic conductive film 10 in between.

Figures 1, 9:
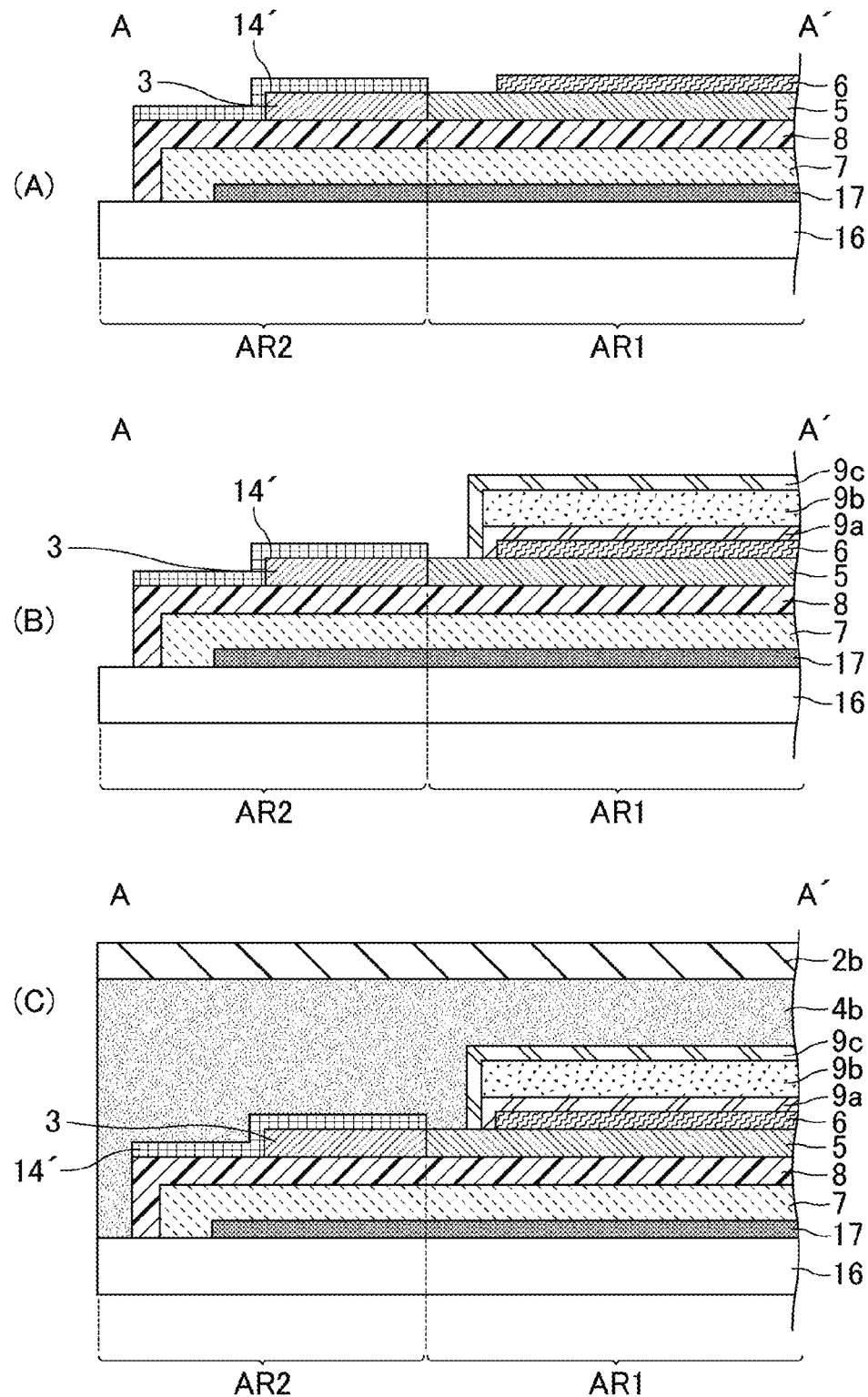
Figure 9:
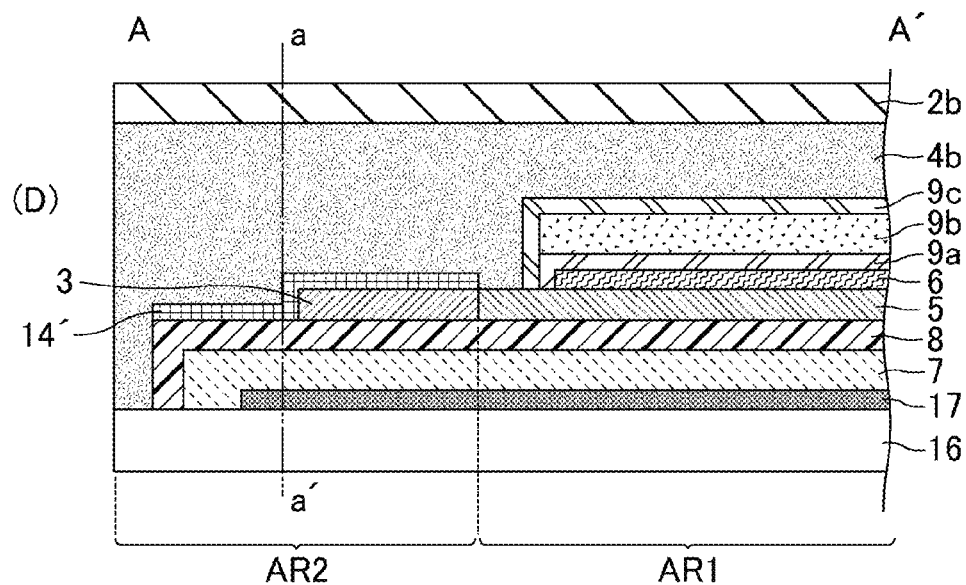
Figure 2:
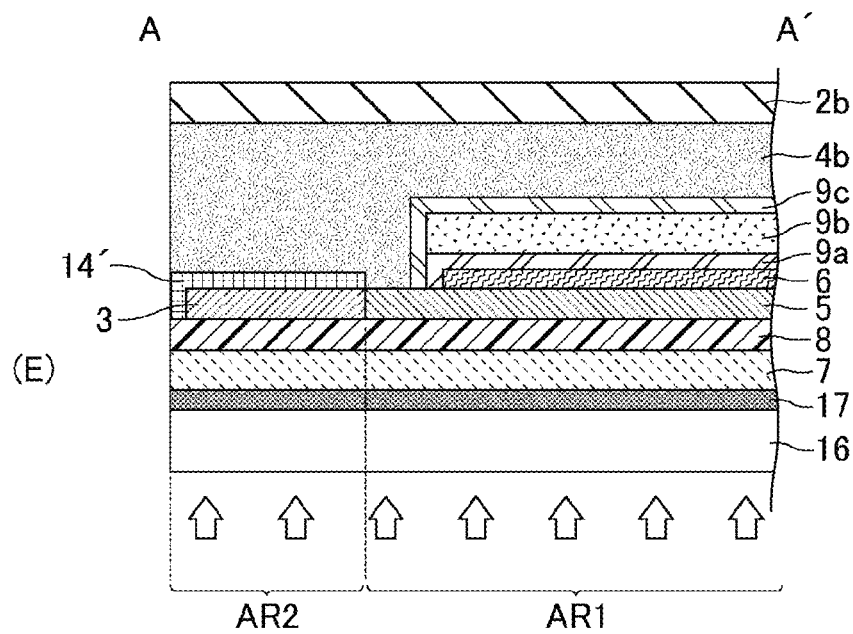
Figures 3, 9:
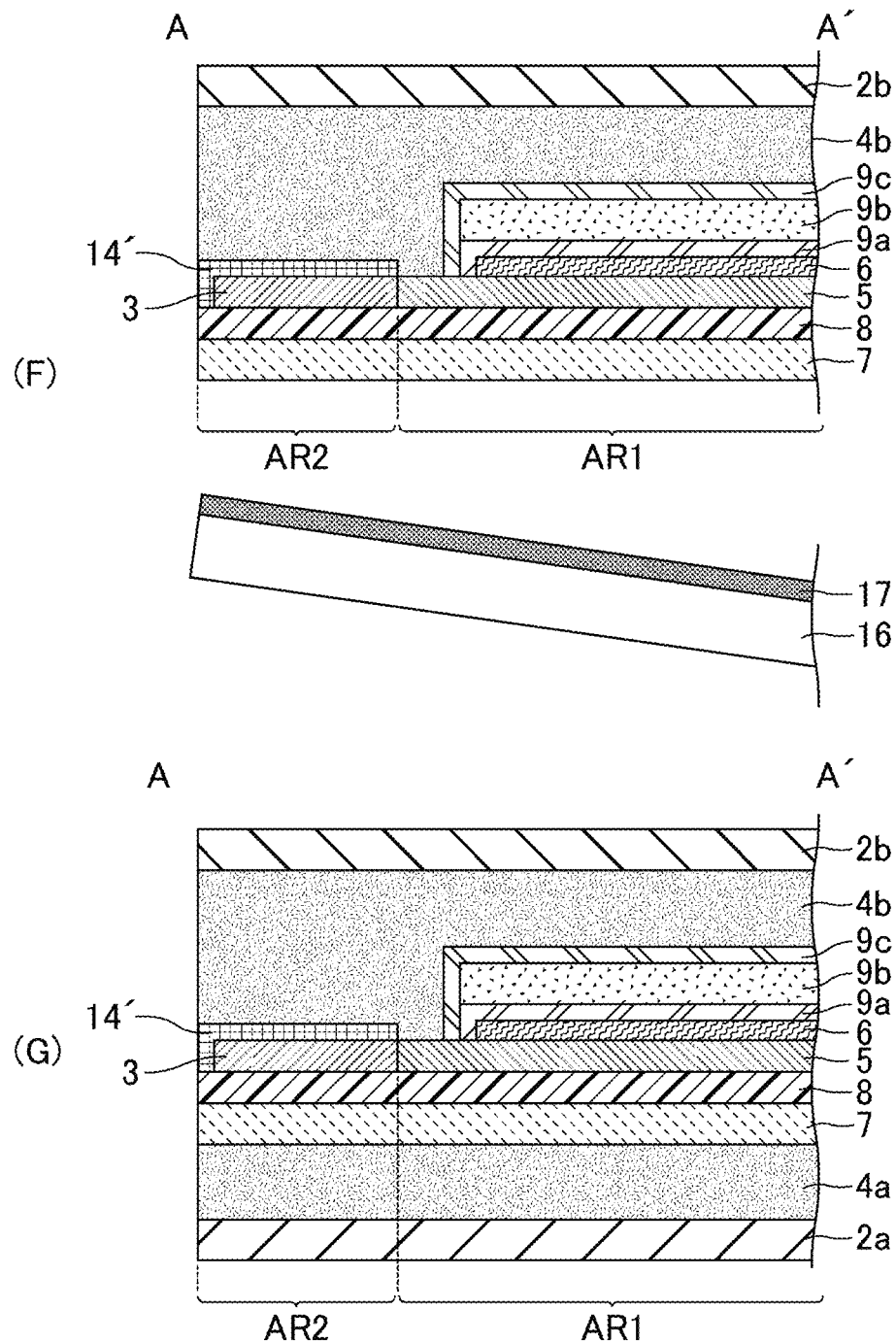
Figures 4, 9:
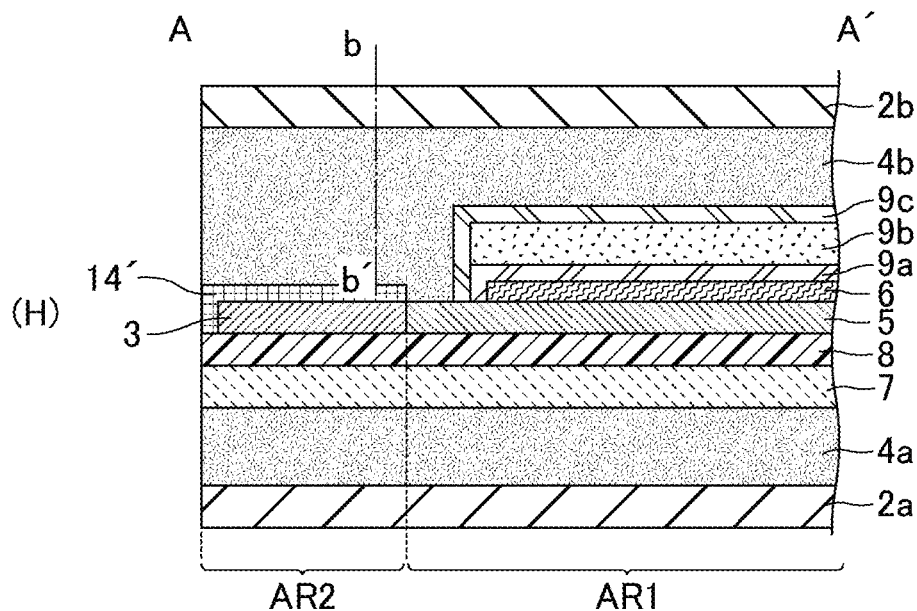

The method for producing a flexible display device of Embodiment 4 is described with reference to FIGS. 9-1 to 9-4. FIGS. 9-1 to 9-4 illustrate schematic views of cross sections taken along the A-A' line in FIG. 1, showing the production flow of the flexible display device of Embodiment 4.

The method for producing a flexible display device of Embodiment 4 is the same as that of Embodiment 1 except that the shape of the sealing film 9c is different and the organic electroluminescent layer 14' is used in place of the sealing film 9b'. Hence, the same points are not described below.

In the present embodiment, the heat-absorbing layer, the polyimide layer, the protective film, the conductive lines, and the terminals are formed by the same respective methods as those described in Embodiment 1. Hence, the same points are not described below.

(A) Formation of Organic Electroluminescent Element

As illustrated in step (A) of FIG. 9-1, the organic electroluminescent element 6 is formed on the conductive line 5 in the display region AR1, and the organic electroluminescent layer 14' (removal layer) is formed to cover the terminal 3 and part of the protective film 8 in the edge region AR2.

The organic electroluminescent element 6 has the structure that has already been described with reference to FIG. 3. Each organic electroluminescent layer 14 included in the organic electroluminescent element 6 may have a single-layer structure consisting of a light-emitting layer, or a multi-layer structure in which a light-emitting layer, a hole injection layer, a hole transport layer, an electron transport layer, an electron injection layer, a hole blocking layer, and an electron blocking layer are laminated. Each organic electroluminescent layer 14 may include a multifunctional layer such as a hole injection-hole transport layer obtained by integrating a hole injection layer and a hole transport layer, and an electron injection-electron transport layer obtained by integrating an electron transport layer and an electron injection layer.

The organic electroluminescent layer 14 may have a structure such as the following structures (a) to (e).

(a) Light-emitting layer (b) Hole injection layer/hole transport layer/light-emitting layer/electron transport layer/electron injection layer (c) Hole injection-hole transport layer/light-emitting layer/electron injection-electron transport layer (d) Hole injection layer/hole transport layer/electron blocking layer/light-emitting layer/hole blocking layer/electron transport layer/electron injection layer (e) Hole injection-hole transport layer/electron blocking layer/light-emitting layer/hole blocking layer/electron injection-electron transport layer The organic electroluminescent layer 14' is formed simultaneously with at least one layer included in the organic electroluminescent layer 14, and has the same composition as the layer(s). The organic electroluminescent layer 14' is formed to facilitate uncovering of terminals in the later step. The interfacial adhesion between the organic electroluminescent layer 14' and the terminal 3 is lower than the interfacial adhesion between the flexible base material 2b and the adhesive layer 4b which are to be placed in the later step, and the interfacial adhesion between the adhesive layer 4b and the organic electroluminescent layer 14'.

The organic electroluminescent layers 14 and 14' are separately disposed as illustrated in FIG. 9-1, but can be simultaneously formed using the same mask. This method eliminates the need for using an additional mask for forming only the organic electroluminescent layer 14'. Here, the organic electroluminescent layers 14 and 14' are separate because the organic electroluminescent layer, if continuously formed on the entire surface, may cause the organic electroluminescent layer in the display region AR1 to be separated upon separation of the upper layer covering the terminal 3 in the edge region AR2 when the terminal is uncovered in the later step, exposing components other than the terminal 3 (e.g. the part of the conductive line 5).

(B) Formation of Sealing Film

As illustrated in step (B) of FIG. 9-1, the sealing film 9a is formed to cover the organic electroluminescent element 6 in the display region AR1. The sealing film 9b is formed on the sealing film 9a in the display region AR1. The sealing film 9c is then formed to cover the sealing film 9b and part of the conductive line 5. Here, the sealing films 9a and 9c are inorganic films, and the sealing film 9b is an organic film.

The sealing films 9a, 9b, and 9c are formed by forming the sealing film 9a (first layer) using a mask, forming the sealing film 9b (second layer) using the same mask as the mask used to form the sealing film 9a, and forming the sealing film 9c (third layer) to cover the sealing film 9b. With this structure, the number of masks used to form the sealing films in Embodiment 4 can be less than the number of masks used to form the sealing films in Embodiment 1 by one.

(C) Attachment of Second Flexible Base Material

As illustrated in step (C) of FIG. 9-1, the flexible base material 2b is attached by the adhesive layer 4b to the laminate to face the glass substrate 16.

(D) Substrate Cutting after Attachment

As illustrated in step (D) of FIG. 9-2, the flexible base material 2b and the adhesive layer 4b are cut from the flexible base material 2b side by a laser, for example, and the remaining layers and the glass substrate 16 are cut from the glass substrate 16 side, along the line a-a'. Here, the cutting position indicated by the line a-a' may be any other position that crosses the heat-absorbing layer 17 but not the conductive line 5 and the terminal 3, so that the position suits the method of separating the glass substrate 16 from the laminate in the interface between the heat-absorbing layer 17 and the polyimide layer 7, in the later step.

(E) Irradiation of Heat-Absorbing Layer with Laser Light

As indicated by the arrows illustrated in step (E) of FIG. 9-2, the laminate is irradiated with laser light from the cut glass substrate 16 side. Thereby, the heat-absorbing layer 17 absorbs heat to decrease the adhesion between the heat-absorbing layer 17 and the polyimide layer 7, so that the glass substrate 16 and the heat-absorbing layer 17 are separated together from the laminate in the interface between the heat-absorbing layer 17 and the polyimide layer 7.

(F) Separation of Glass Substrate

As illustrated in step (F) of FIG. 9-3, the glass substrate 16 and the heat-absorbing layer 17 are separated together from the laminate in the interface between the heat-absorbing layer 17 and the polyimide layer 7.

(G) Attachment of First Flexible Base Material

As illustrated in step (G) of FIG. 9-3, the flexible base material 2a is attached by the adhesive layer 4a to the laminate to face the flexible base material 2b.

(H) Uncovering of Terminals

The flexible base material 2b and the adhesive layer 4b are cut from the flexible base material 2b side and a cut is made in the organic electroluminescent layer 14', along the line b-b' illustrated in step (H) of FIG. 9-4. The suitable cutting method is laser irradiation. Here, the same laser as the laser used in the above-described cutting of the attached substrate can be used.

Next, the edge region AR2 side part of the cut organic electroluminescent layer 14' is separated. The cut in the organic electroluminescent layer 14' enables separation because, as described above, the interfacial adhesion between the organic electroluminescent layer 14' and the terminals 3 is lower than the interfacial adhesion between the flexible base material 2b and the adhesive layer 4b and the interfacial adhesion between the adhesive layer 4b and the organic electroluminescent layer 14'.

The position of the end b' of the cutting position indicated by the line b-b' is in the edge region AR2 in the vicinity of the display region AR1 in the right-left direction of step (H) of FIG. 9-4, and is at the depth not deeper than the interface between the organic electroluminescent layer 14' and the terminal 3 in the up-down direction of step (H) of FIG. 9-4. Here, the end b' of the cutting position is preferably at a position (depth) that is 50% to 90% of the thickness of the organic electroluminescent layer 14' on the terminal 3. The greater the depth to which the organic electroluminescent layer 14' is cut, the easier it is to separate the part of the cut organic electroluminescent layer 14'. If the depth to which the organic electroluminescent layer 14' is cut is less than 50% of the thickness of the organic electroluminescent layer 14' on the terminal 3, it may be difficult to separate the organic electroluminescent layer 14'. If the depth to which the organic electroluminescent layer 14' is cut is more than 90% of the thickness of the organic electroluminescent layer 14' on the terminal 3, the terminal 3 may be damaged during the cutting because the organic electroluminescent layer 14' is usually as thin as about 200 nm to 400 nm.

The edge region AR2 side parts of the cut flexible base material 2b, adhesive layer 4b, and organic electroluminescent layer 14' are removed, so that the terminals 3 are exposed.

In this manner, the terminals 3 can be uncovered without being damaged. Also, since the terminals are uncovered by the dry method, degradation of the properties of the organic electroluminescent element 6 can be sufficiently prevented.

After the terminals 3 are uncovered as described above, the flexible printed circuit board 11 is pressed onto the exposed terminals 3 using the anisotropic conductive film 10. Thereby, the flexible display device 1c illustrated in FIG. 8 is completed.

Here, in the flexible display device 1c, the organic electroluminescent layer 14' is left in the vicinity of the flexible printed circuit board 11 after the cutting in the above-described uncovering of the terminals. This remaining film shows that the device is produced by the production method of the present embodiment.

The reason that the organic electroluminescent layer 14' is left is described below. In consideration of the blur amount in vapor deposition of the organic electroluminescent layer 14' using a mask, it is difficult to cut off the electroluminescent layer 14' at the exact end of the organic electroluminescent layer 14' to completely remove the cut organic electroluminescent layer 14'. Usually, vapor deposition gives a great blur amount, and thus the thickness of the end of the organic electroluminescent layer 14' may be different from the designed thickness. This means that in order to cut the organic electroluminescent layer 14' at a position where the thickness is stable for an increase in the production efficiency, the conditions such as the cutting position need to be adjusted each time of cutting. Furthermore, in consideration of cutting precision of the cutting devices, it is difficult to cut the organic electroluminescent layer 14' at the exact end of the organic electroluminescent layer 14'. Therefore, the organic electroluminescent layer 14' is left in the flexible display device 1c.

In the present embodiment, components such as an organic electroluminescent element are formed on the main surface of the glass substrate, and the glass substrate is separated to be replaced by a flexible base material. Alternative examples of the present embodiment include the case in which components such as an organic electroluminescent element are formed on a product obtained by attaching a flexible base material to the main surface of a glass substrate, and the glass substrate is separated in the later step. In this case, the method for producing a flexible display device is the same as that in Embodiment 2 except that the shape of the sealing film 9c is different and the organic electroluminescent layer 14' is formed in place of the sealing film 9b'.

The alternative examples of the present embodiment also include the case in which components such as an organic electroluminescent element are formed on the main surface of a flexible base material. In this case, the method for producing a flexible display device is the same as that in Embodiment 3 except that the shape of the sealing film 9c is different and the organic electroluminescent layer 14' is formed in place of the sealing film 9b'.

Embodiment 5

In Embodiment 5, a film including a self-adsorption layer is used as the removal layer. A flexible display device is produced by forming components such as an organic electroluminescent element on the main surface of the glass substrate, and separating the glass substrate to replace the glass substrate with the flexible base material.

Figure 10:
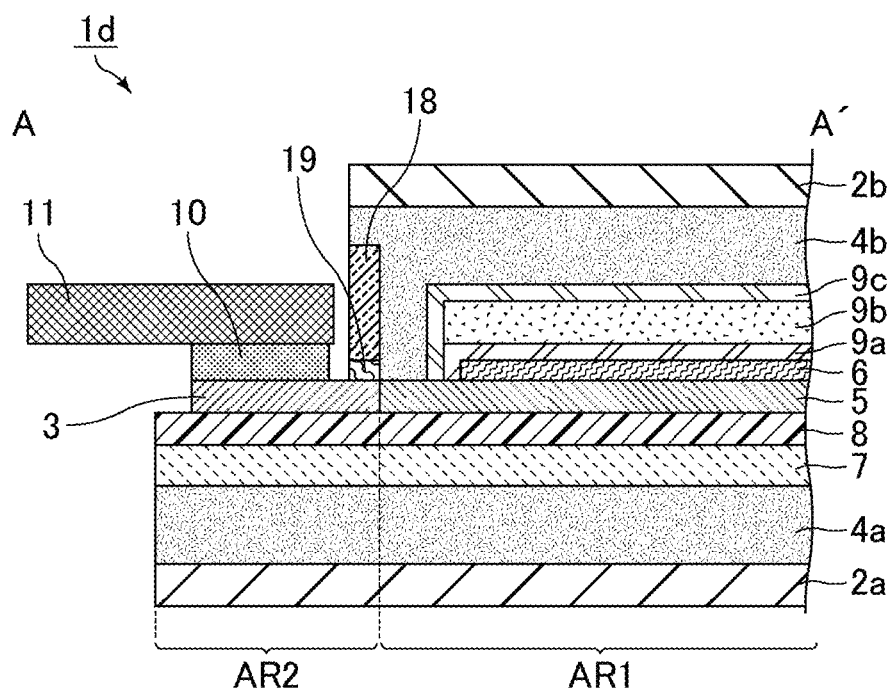
FIG. 10 is a schematic cross-sectional view illustrating a cross section of a flexible display device of Embodiment 5 taken along the A-A' line in FIG. 1.

The structure of the flexible display device of Embodiment 5 in a plan view is the same as that of Embodiment 1, and thus the schematic plan view thereof is as illustrated in FIG. 1. FIG. 10 is a schematic cross-sectional view illustrating a cross section of a flexible display device of Embodiment 5 taken along the A-A' line in FIG. 1. As illustrated in FIG. 10, a flexible display device 1d of Embodiment 5 is the same as the flexible display device 1a of Embodiment 1 except that the shape of the sealing film 9c is different and a film 18 including a self-adsorption layer 19 is used in place of the sealing film 9b'. Hence, the same points are not described below.

As illustrated in FIG. 10, the adhesive layer 4a, the polyimide layer 7, and the protective film 8 are sequentially laminated on the main surface of the flexible base material 2a. The conductive line 5 is formed on the protective film 8 in the display region AR1, and the terminal 3 from the conductive line 5 is led out onto the protective film 8 in the edge region AR2. On the conductive line 5 in the display region AR1, the organic electroluminescent element 6, and the sealing films 9a, 9b, and 9c covering the organic electroluminescent element 6 are formed. Also in the edge region AR2, the self-adsorption layer 19 and the film 18 are laminated on the terminal 3 in the vicinity of the display region AR1. In a portion in which the terminal 3 is exposed, the flexible printed circuit board 11 is laminated with the anisotropic conductive film 10 in between.

Figures 1, 11:
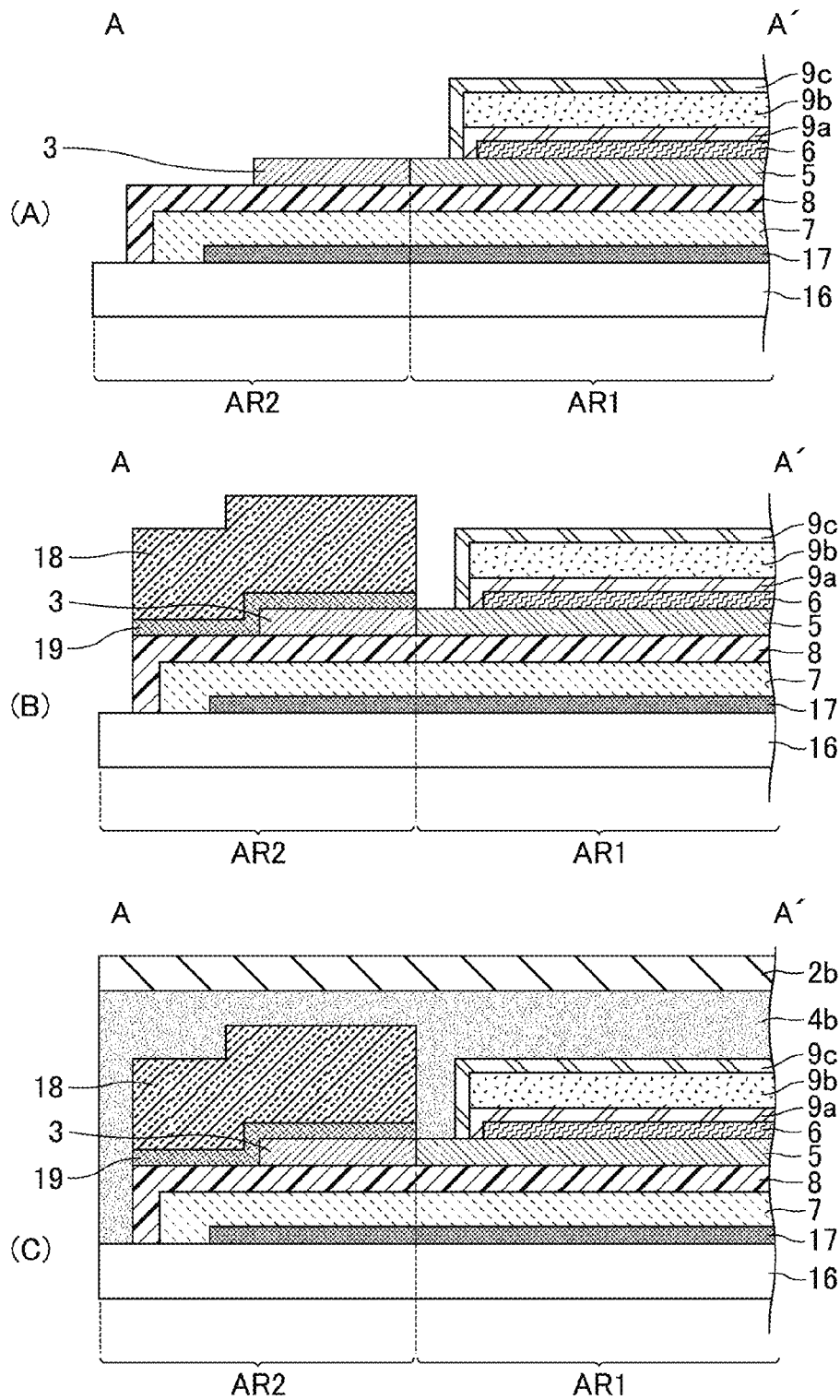
Figure 11:
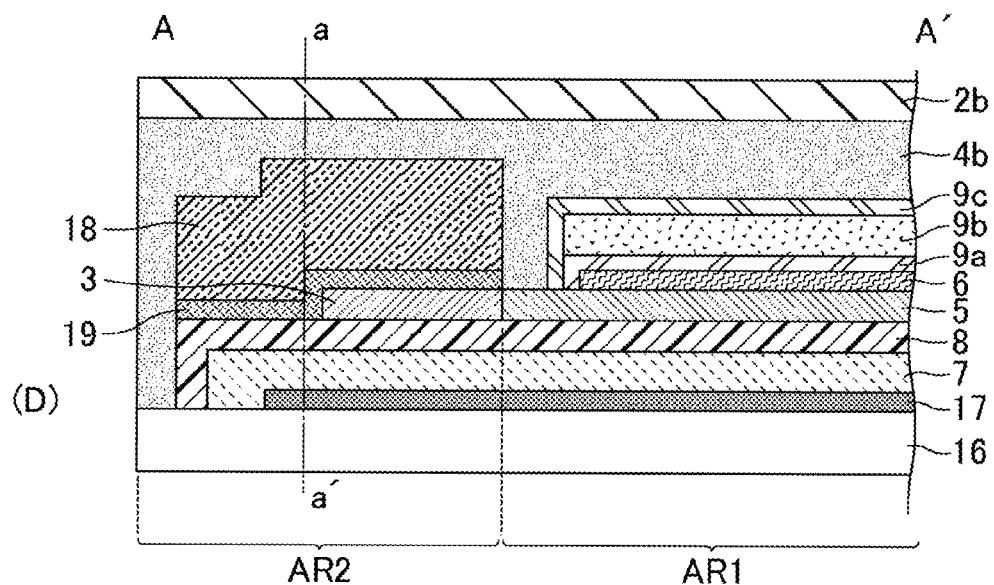
Figure 2:
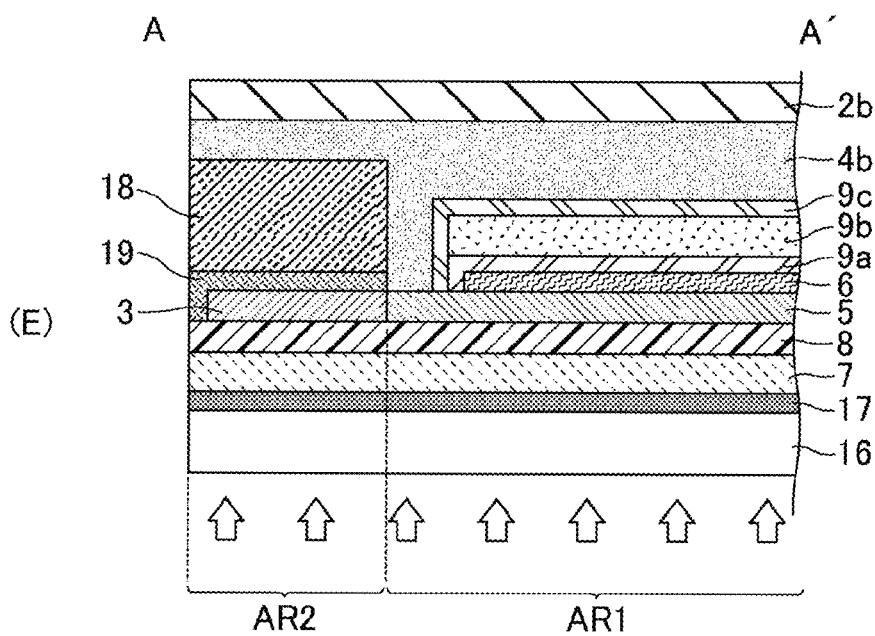
Figure 11:
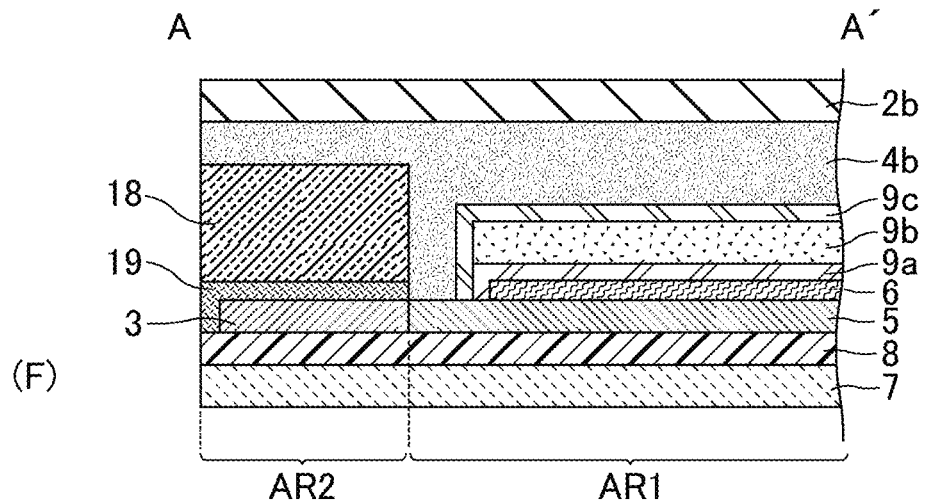
Figure 3:
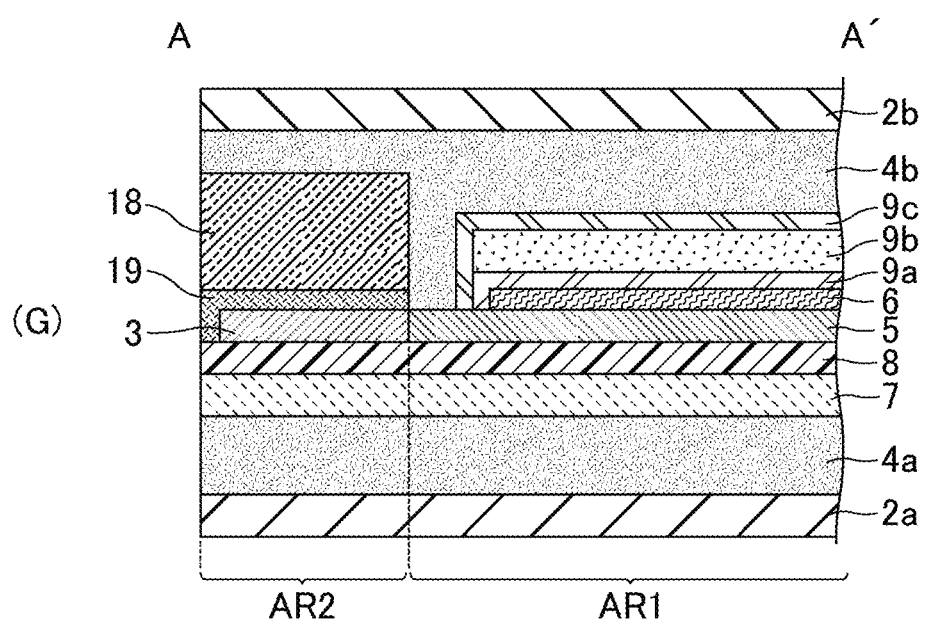
Figures 4, 11:
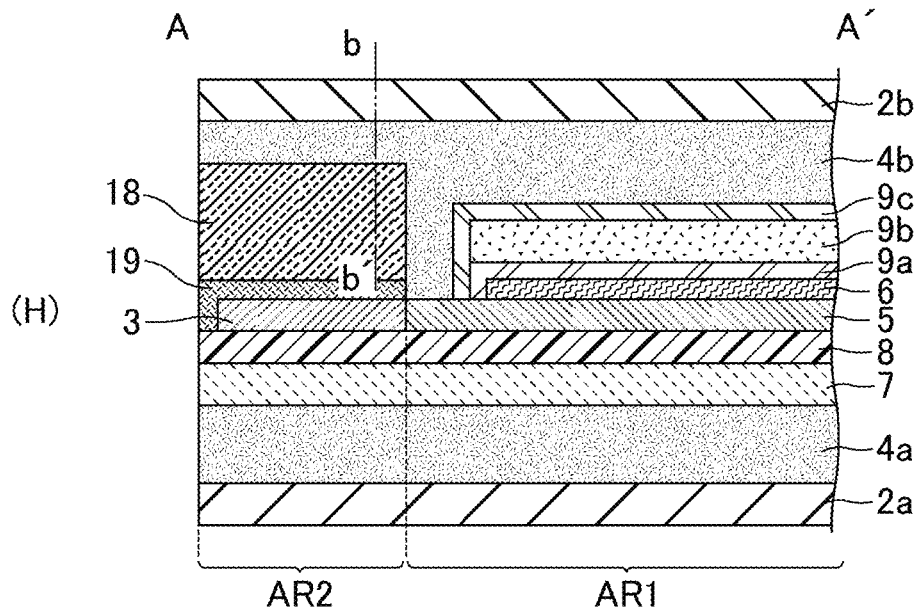

The method for producing a flexible display device of Embodiment 5 is described with reference to FIGS. 11-1 to 11-4. FIGS. 11-1 to 11-4 illustrate schematic views of cross sections taken along the A-A' line in FIG. 1, showing the production flow of the flexible display device of Embodiment 5.

The method for producing a flexible display device of Embodiment 5 is the same as that of Embodiment 1 except that the shape of the sealing film 9c is different and the film 18 including the self-adsorption layer 19 is used in place of the sealing film 9b'. Hence, the same points are not described below.

In the present embodiment, the heat-absorbing layer/polyimide layer, the protective film, the conductive lines/terminals, and the organic electroluminescent element are formed by the same respective methods as those described in Embodiment 1. Hence, the same points are not described below.

(A) Formation of Sealing Film

As illustrated in step (A) of FIG. 11-1, the sealing film 9a is formed to cover the organic electroluminescent element 6 in the display region AR1. The sealing film 9b is formed on the sealing film 9a in the display region AR1. The sealing film 9c is then formed to cover the sealing film 9b and part of the conductive line 5. Here, the sealing films 9a and 9c are inorganic films, and the sealing film 9b is an organic film.

The sealing films 9a, 9b, and 9c are formed by forming the sealing film 9a (first layer) using a mask, forming the sealing film 9b (second layer) using the same mask as the mask used to form the sealing film 9a, and forming the sealing film 9c (third layer) to cover the sealing film 9b. With this structure, the number of masks used to form the sealing film in Embodiment 5 can be less than the number of masks used to form the sealing film in Embodiment 1 by one.

(B) Attachment of Film

As illustrated in step (B) of FIG. 11-1, the film 18 including the self-adsorption layer 19 is attached as a removal layer to the laminate to cover the terminal 3 and part of the protective film 8 in the edge region AR2. Here, it is possible to attach the film 18 to the laminate by an adhesive or the like. Yet in the case of using the film 18 including the self-adsorption layer 19, the terminals can be suitably uncovered because the adhesive or the like is not adhered to the terminal 3 when the film 18 and the self-adsorption layer 19 are separated together in the later step. Examples of the material of the film 18 include polyethylene terephthalate (PET). Examples of the self-adsorption layer 19 include a layer formed by surface-treating the film 18, an olefin-based adhesive layer, and a resin layer of which the adhesion is decreased by UV irradiation.

The film 18 including the self-adsorption layer 19 is formed to facilitate uncovering of terminals in the later step. The interfacial adhesion between the self-adsorption layer 19 and the terminal 3 is lower than the interfacial adhesion between the flexible base material 2b and the adhesive layer 4b, and the interfacial adhesion between the adhesive layer 4b and the film 18. In the case where the interfacial adhesion between the self-adsorption layer 19 and the terminal 3 is higher than the interfacial adhesion between the flexible base material 2b and the adhesive layer 4b and the interfacial adhesion between the adhesive layer 4b and the film 18, separation of the film 18 including the self-adsorption layer 19 may damage the terminal 3 or leave an unseparated part, which raises the need for removing the unseparated part by a remover or the like.

In the present embodiment, the film is attached to the laminate after formation of the sealing film. This is because the CVD or vapor deposition forms a sealing film in vacuum, and gases generated from the film 18 may degrade the properties of the organic electroluminescent element 6. In the case where the film 18 does not affect the properties of the organic electroluminescent element 6 in vacuum, the film attachment in the present embodiment may be performed before the formation of a sealing film.

The number of production steps of the flexible display device in the present embodiment which includes the film attachment step is greater than the number of production steps in Embodiment 1. Yet, an additional mask is not necessary because the organic electroluminescent element 6 and the sealing films 9a, 9b, and 9c can be formed in the same pattern as the pattern in the common organic electroluminescent display device so that the same mask can be used.

(C) Attachment of Second Flexible Base Material

As illustrated in step (C) of FIG. 11-1, the flexible base material 2b is attached by the adhesive layer 4b to the laminate to face the glass substrate 16.

(D) Substrate Cutting after Attachment

As illustrated in step (D) of FIG. 11-2, the flexible base material 2b, the adhesive layer 4b, the film 18, and the self-adsorption layer 19 are cut from the flexible base material 2b side by a laser, for example, and the remaining layers and the glass substrate 16 are cut from the glass substrate 16 side, along the line a-a'. Here, the cutting position indicated by the line a-a' may be any other position that crosses the heat-absorbing layer 17 but not the conductive line 5 and the terminal 3, so that the position suits the method of separating the glass substrate 16 from the laminate in the interface between the heat-absorbing layer 17 and the polyimide layer 7, in the later step.

(E) Irradiation of Heat-Absorbing Layer with Laser Light

As indicated by the arrows illustrated in step (E) of FIG. 11-2, the laminate is irradiated with laser light from the cut glass substrate 16 side. Thereby, the heat-absorbing layer 17 absorbs heat to decrease the adhesion between the heat-absorbing layer 17 and the polyimide layer 7, so that the glass substrate 16 and the heat-absorbing layer 17 are separated together from the laminate in the interface between the heat-absorbing layer 17 and the polyimide layer 7, in the later step.

(F) Separation of Glass Substrate

As illustrated in step (F) of FIG. 11-3, the glass substrate 16 and the heat-absorbing layer 17 are separated together from the laminate in the interface between the heat-absorbing layer 17 and the polyimide layer 7.

(G) Attachment of First Flexible Base Material

As illustrated in step (G) of FIG. 11-3, the flexible base material 2a is attached by the adhesive layer 4a to the laminate to face the flexible base material 2b.

(H) Uncovering of Terminals

The flexible base material 2b, the adhesive layer 4b, and the film 18 are cut from the flexible base material 2b side and a cut is made in the self-adsorption layer 19, along the line b-b' illustrated in step (H) of FIG. 11-4. The suitable cutting method is laser irradiation. Here, the same laser as the laser used in the above-described cutting of the attached substrate can be used.

Next, the edge region AR2 side parts of the cut film 18 and self-adsorption layer 19 are separated. The cut in the self-adsorption layer 19 enables separation because the interfacial adhesion between the self-adsorption layer 19 and the terminals 3 is lower than the interfacial adhesion between the flexible base material 2b and the adhesive layer 4b and the interfacial adhesion between the adhesive layer 4b and the film 18.

The position of the end b' of the cutting position indicated by the line b-b' is in the edge region AR2 in the vicinity of the display region AR1 in the right-left direction of step (H) of FIG. 11-4, and is at the depth not deeper than the interface between the self-adsorption layer 19 and the terminal 3 in the up-down direction of step (H) of FIG. 11-4. Here, the end b' of the cutting position is preferably at a position (depth) that is 50% to 90% of the thickness of the self-adsorption layer 19 on the terminal 3. The greater the depth to which the self-adsorption layer 19 is cut, the easier it is to separate the parts of the cut film 18 and self-adsorption layer 19. If the depth to which the self-adsorption layer 19 is cut is less than 50% of the thickness of the self-adsorption layer 19 on the terminal 3, it may be difficult to separate the self-adsorption layer 19. If the depth to which the self-adsorption layer 19 is cut is more than 90% of the thickness of the self-adsorption layer 19 on the terminal 3, the terminal 3 may be damaged during the cutting.

The edge region AR2 side parts of the cut flexible base material 2b, adhesive layer 4b, film 18, and self-adsorption layer 19, so that the terminals 3 are exposed.

In this manner, the terminals 3 can be uncovered without being damaged. Also, since the terminals are uncovered by the dry method, degradation of the properties of the organic electroluminescent element 6 can be sufficiently prevented.

After the terminals 3 are uncovered as described above, the flexible printed circuit board 11 is pressed onto the exposed terminals 3 using the anisotropic conductive film 10. Thereby, the flexible display device 1d illustrated in FIG. 10 is completed.

Here, in the flexible display device 1d, the film 18 and the self-adsorption layer 19 are left in the vicinity of the flexible printed circuit board 11 after the cutting in the above-described uncovering of the terminals. This remaining film shows that the device is produced by the production method of the present embodiment. In the above uncovering of the terminals, in consideration of cutting precision of the cutting devices, it is difficult to cut the film 18 and the self-adsorption layer 19 at the exact ends of the film 18 and the self-adsorption layer 19. Therefore, the film 18 and the self-adsorption layer 19 are left in the flexible display device 1d.

In the present embodiment, components such as an organic electroluminescent element are formed on the main surface of the glass substrate, and the glass substrate is separated to be replaced by a flexible base material. Alternative examples of the present embodiment include the case in which components such as an organic electroluminescent element are formed on a product obtained by attaching a flexible base material to the main surface of a glass substrate, and the glass substrate is separated in the later step. In this case, the method for producing a flexible display device is the same as that in Embodiment 2 except that the shape of the sealing film 9c is different and the film 18 including the self-adsorption layer 19 is formed in place of the sealing film 9b'.

The alternative examples of the present embodiment also include the case in which components such as an organic electroluminescent element are formed on the main surface of a flexible base material. In this case, the method for producing a flexible display device is the same as that in Embodiment 3 except that the shape of the sealing film 9*c* is different and the film 18 including the self-adsorption layer 19 is formed in place of the sealing film 9*b*'.

Embodiment 6

Embodiment 6 relates to a flexible display device including a liquid crystal layer, and utilizes an interlayer film as the removal layer. A flexible display device is produced by placing components such a liquid crystal layer on the main surface of the glass substrate, and separating the glass substrate to replace the glass substrate with the flexible base material.

Figure 12:
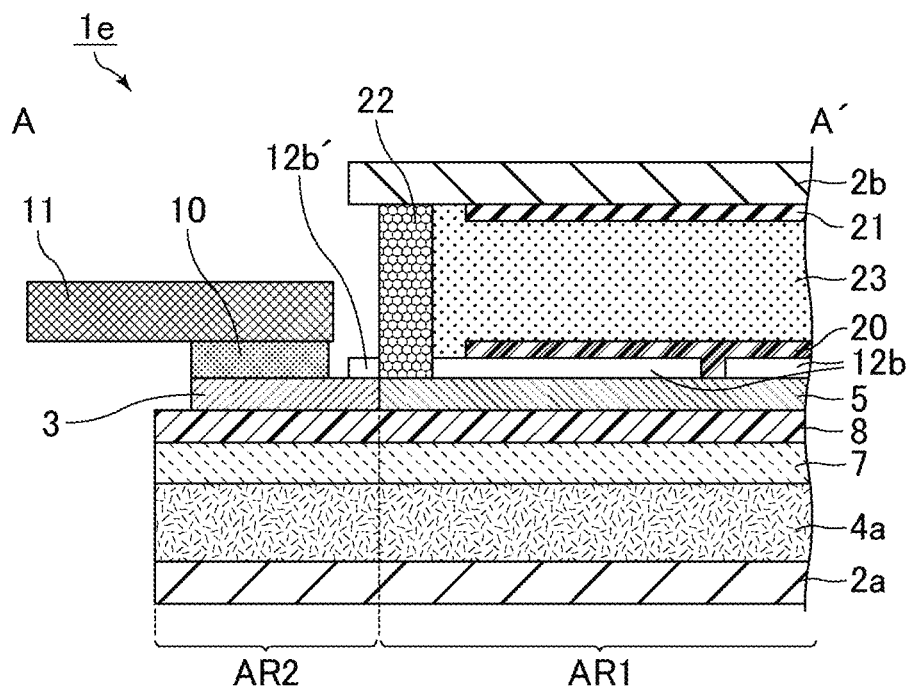
FIG. 12 is a schematic cross-sectional view illustrating a cross section of a flexible display device of Embodiment 6 taken along the A-A' line in FIG. 1.

The structure of the flexible display device of Embodiment 6 in a plan view is the same as that of Embodiment 1, and thus the schematic plan view thereof is as illustrated in FIG. 1. FIG. 12 is a schematic cross-sectional view illustrating a cross section of a flexible display device of Embodiment 6 taken along the A-A' line in FIG. 1. As illustrated in FIG. 12, a flexible display device 1*e* of Embodiment 6 has a structure in which a liquid crystal layer 23 and a sealing material 22 are placed between the flexible base material 2*a* and the flexible base material 2*b*.

The adhesive layer 4*a*, the polyimide layer 7, and the protective film 8 are sequentially laminated on the main surface of the flexible base material 2*a*. The conductive line 5 is formed on the protective film 8 in the display region AR1, and the terminal 3 from the conductive line 5 is led out onto the protective film 8 in the edge region AR2. On the conductive line 5 in the display region AR1, an interlayer film 12*b* provided with openings, and pixel electrodes 20 electrically connected to the conductive lines 5 through the openings in the interlayer film 12*b* are formed. Also in the edge region AR2, an interlayer film 12*b*' is laminated on the terminal 3 in the vicinity of the display region AR1. On the liquid crystal layer 23 side surface of the flexible base material 2*b*, a color filter layer 21 facing the pixel electrode 20 is placed. On a portion in which the terminal 3 is exposed, the flexible printed circuit board 11 is laminated with the anisotropic conductive film 10 in between.

Figure 13:
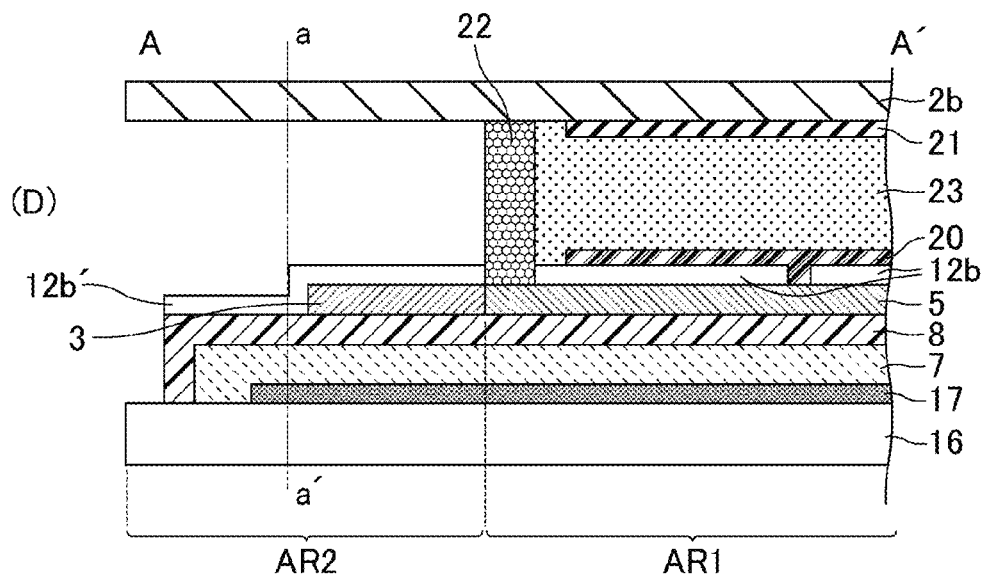
Figure 2:
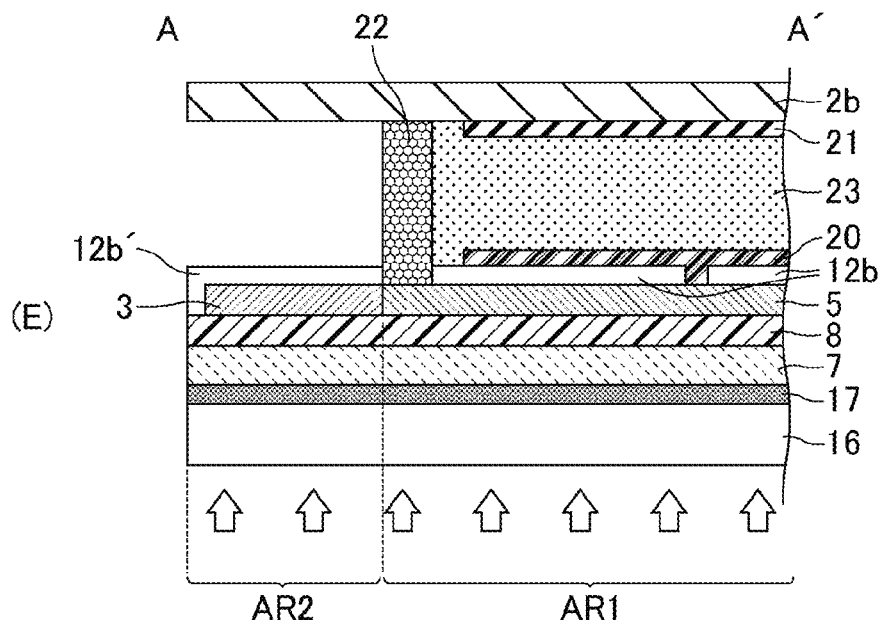
Figure 13:
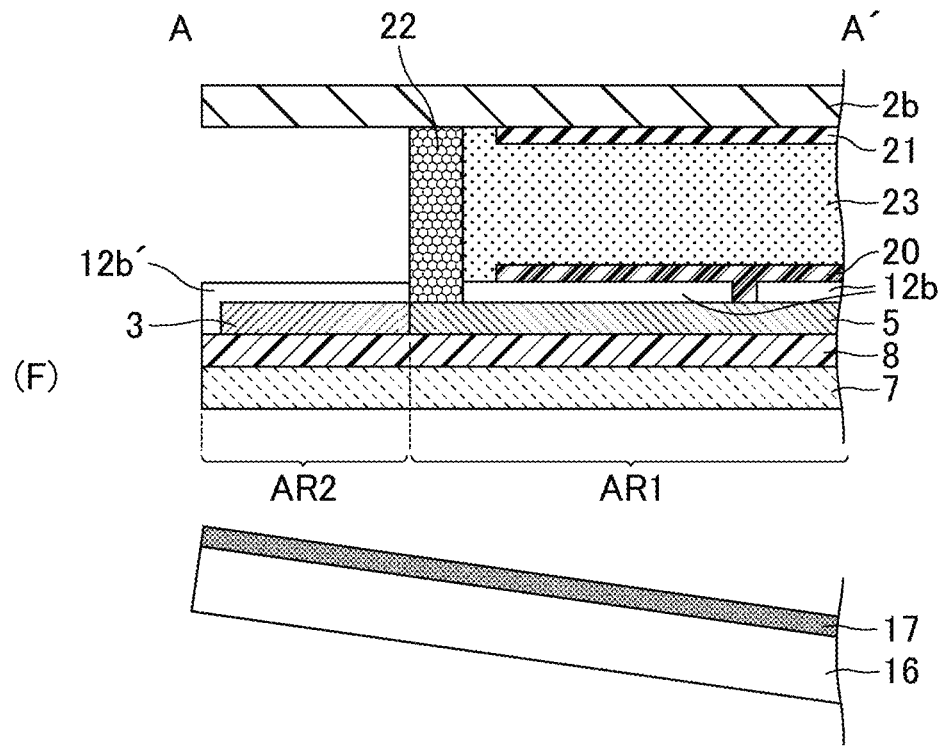
Figure 3:
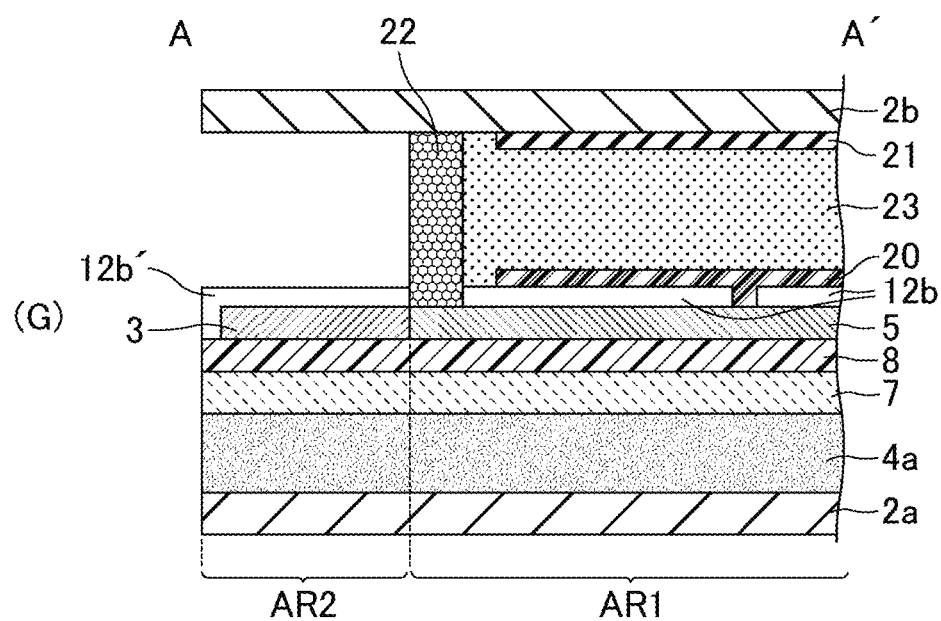
Figures 4, 13:
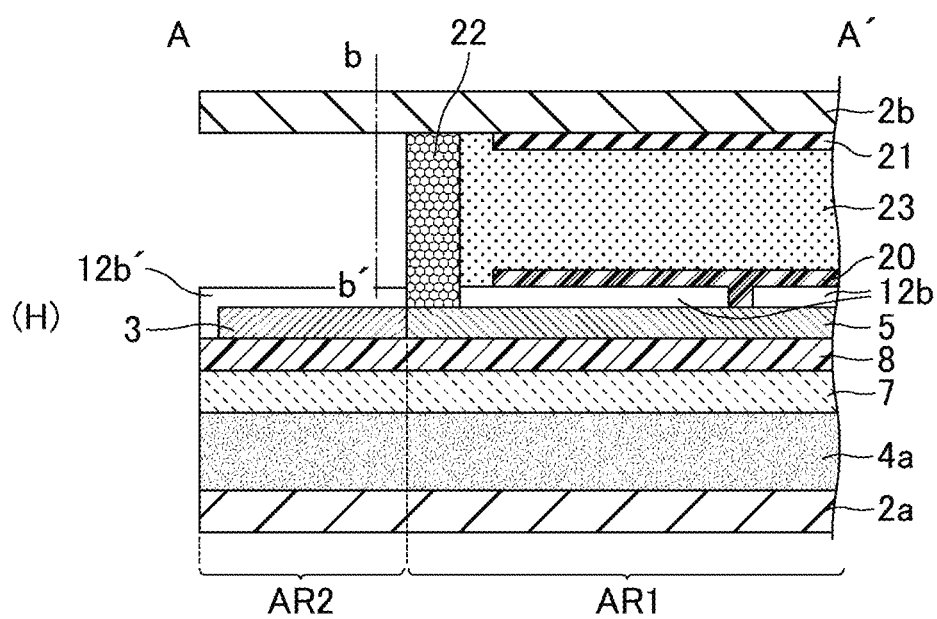

The method for producing a flexible display device of Embodiment 6 is described with reference to FIGS. 13-1 to 13-4. FIGS. 13-1 to 13-4 illustrate schematic views of cross sections taken along the A-A' line in FIG. 1, showing the production flow of the flexible display device of Embodiment 6.

In the present embodiment, the heat-absorbing layer, the polyimide layer, the protective film, the conductive lines, and the terminals are formed by the same respective methods as those described in Embodiment 1. Hence, the same points are not described below.

(A) Formation of Interlayer Film

As illustrated in step (A) of FIG. 13-1, the interlayer film 12*b* provided with openings is formed on the conductive line 5 in the display region AR1, and the interlayer film 12*b*' is formed as a removal layer to cover the terminal 3 and part of the protective film 8 in the edge region AR2. Here, the interlayer films 12*b* and 12*b*' have the same composition. The interlayer film 12*b*' is formed to facilitate uncovering of terminals in the later step. Examples of the material of the interlayer films 12*b* and 12*b*' include acrylic resin.

The interlayer films 12*b* and 12*b*' are separately disposed as illustrated in step (A) of FIG. 13-1, but are simultaneously formed using the same mask. This method eliminates the need for using an additional mask for forming only the interlayer film 12*b*'. Here, the interlayer films 12*b* and 12*b*' are separate because the interlayer film, if continuously formed on the entire surface, causes the interlayer film and the sealing material 22 in the display region AR1 to be separated upon separation of the upper layer covering the terminal 3 in the edge region AR2 when the terminal is uncovered in the later step, exposing components other than the terminal 3 (e.g. the part of the conductive line 5).

(B) Formation of Pixel Electrode

As illustrated in step (B) of FIG. 13-1, in the display region AR1, the pixel electrode 20 is formed on the interlayer film 12*b* and part of the conductive line 5 corresponding to an opening so that the pixel electrode 20 is electrically connected to the conductive line 5 through the opening in the interlayer film 12*b*.

(C) Attachment of Second Flexible Base Material

As illustrated in step (C) of FIG. 13-1, the flexible base material 2*b* (hereinafter, also referred to as a color filter substrate) on the main surface of which the color filter layer 21 is formed is attached by the sealing material 22 to the laminate to face the glass substrate 16. Here, the attachment is performed such that the color filter layer 21 faces the pixel electrode 20. The liquid crystal material forming the liquid crystal layer 23 may be dropped, before attachment, onto one of the color filter substrate and the substrate in which the multiple layers are formed on the main surface of the glass substrate 16, or the liquid crystal material may be injected between attached substrates. Also, the method for producing a color filter substrate may be a method directly forming the color filter layer 21 on the main surface of the flexible base material 2*b*, or may be a method disposing a separation transparent film on the glass substrate, forming the color filter 21 on the transparent film, separating the glass substrate to replace the glass substrate with the flexible base material 2*b* by an adhesive, for example.

(D) Substrate Cutting after Attachment

As illustrated in step (D) of FIG. 13-2, the flexible base material 2*b* is cut from the flexible base material 2*b* side by a laser, for example, and the glass substrate 16 and the layers other than the terminal 3 in the edge region AR2 are cut from the glass substrate 16 side, along the line a-a'. Here, the cutting position indicated by the line a-a' may be any other position that crosses the heat-absorbing layer 17 but not the conductive line 5 and the terminal 3, so that the position suits the method of separating the glass substrate 16 from the laminate in the interface between the heat-absorbing layer 17 and the polyimide layer 7, in the later step.

(E) Irradiation of Heat-Absorbing Layer with Laser Light

As indicated by the arrows illustrated in step (E) of FIG. 13-2, the laminate is irradiated with laser light from the cut glass substrate 16 side. Thereby, the heat-absorbing layer 17 absorbs heat to decrease the adhesion between the heat-absorbing layer 17 and the polyimide layer 7, so that the glass substrate 16 and the heat-absorbing layer 17 are separated together from the laminate in the interface between the heat-absorbing layer 17 and the polyimide layer 7.

(F) Separation of Glass Substrate

As illustrated in step (F) of FIG. 13-3, the glass substrate 16 and the heat-absorbing layer 17 are separated together from the laminate in the interface between the heat-absorbing layer 17 and the polyimide layer 7.

(G) Attachment of First Flexible Base Material

As illustrated in step (G) of FIG. 13-3, the flexible base material 2*a* is attached by the adhesive layer 4*a* to the laminate to face the flexible base material 2*b*.

(H) Uncovering of Terminals

The flexible base material 2*b* is cut from the flexible base material 2*b* side and a cut is made in the interlayer film 12*b*', along the line b-b' illustrated in step (H) of FIG. 13-4. The suitable cutting method is laser irradiation. Here, the same laser as the laser used in the above-described cutting of the attached substrate can be used.

Next, the edge region AR2 side part of the cut interlayer film 12b' is separated. The cut in the interlayer film 12b' enables separation because the interfacial adhesion between the interlayer film 12b' and the terminals 3 is low.

The position of the end b' of the cutting position indicated by the line b-b' is in the edge region AR2 in the vicinity of the display region AR1 in the right-left direction of step (H) of FIG. 13-4, and is at the depth not deeper than the interface between the interlayer film 12b' and the terminal 3 in the up-down direction of step (H) of FIG. 13-4. Here, the end b' of the cutting position is preferably at a position (depth) that is 50% to 90% of the thickness of the interlayer film 12b' on the terminal 3. The greater the depth to which the interlayer film 12b' is cut, the easier it is to separate the part of the cut interlayer film 12b'. If the depth to which the interlayer film 12b' is cut is less than 50% of the thickness of the interlayer film 12b' on the terminal 3, it may be difficult to separate the interlayer film 12b'. If the depth to which the interlayer film 12b' is cut is more than 90% of the thickness of the interlayer film 12b' on the terminal 3, the terminal 3 may be damaged during the cutting.

Next, the edge region AR2 side parts of the cut flexible base material 2b and the interlayer film 12b' are removed, so that the terminals 3 are exposed.

In this manner, the terminals 3 can be uncovered without being damaged. Also, since the terminals are uncovered by the dry method, degradation of the properties of the liquid crystal layer 23 can be sufficiently prevented.

After the terminals 3 are uncovered as described above, the flexible printed circuit board 11 is pressed onto the exposed terminals 3 using the anisotropic conductive film 10. Thereby, the flexible display device 1e illustrated in FIG. 12 is completed.

Here, in the flexible display device 1e, the interlayer film 12b' is left in the vicinity of the flexible printed circuit board 11 after the cutting in the above-described uncovering of the terminals. This remaining film shows that the device is produced by the production method of the present embodiment.

The reason that the interlayer film 12b' is left is described below. In consideration of the blur amount in formation of the interlayer film 12b' using a mask, it is difficult to cut off the interlayer film 12b' at the exact end of the interlayer film 12b' to completely remove the cut interlayer film 12b'. Also, the thickness of the end of the interlayer film 12b' may be different from the designed thickness. This means that in order to cut the interlayer film 12b' at a position where the thickness is stable for an increase in the production efficiency, the conditions such as the cutting position need to be adjusted each time of cutting. Furthermore, in consideration of cutting precision of the cutting devices, it is difficult to cut the interlayer film 12b' at the exact end of the interlayer film 12b'. Also, in the case that the cutting position is off to the display region AR1 side, the sealing material 22 may be damaged. Therefore, the interlayer film 12b' is left in the flexible display device 1e.

In the present embodiment, components such as a liquid crystal layer are formed on the main surface of the glass substrate, and the glass substrate is separated to be replaced by a flexible substrate. Alternative examples of the present embodiment include the case in which components such as a liquid crystal layer are formed on a product obtained by attaching a flexible base material to the main surface of a glass substrate, and the glass substrate is separated in the later step. In this case, the method for producing a flexible display device is the same as that in Embodiment 2 except that the interlayer films 12b and 12b', the pixel electrode 20, the sealing material 22, and the liquid crystal layer 23 are formed in place of the organic electroluminescent element 6, the sealing films 9a, 9b, 9b', and 9c, and the adhesive layer 4b.

The alternative examples of the present embodiment also include the case in which components such as a liquid crystal layer are formed on the main surface of a flexible base material. In this case, the method for producing a flexible display device is the same as that in Embodiment 3 except that the interlayer films 12b and 12b', the pixel electrode 20, the sealing material 22, and the liquid crystal layer 23 are formed in place of the organic electroluminescent element 6, the sealing films 9a, 9b, 9b', and 9c, and the adhesive layer 4b.

[Remarks]

Hereinafter, preferred modes of the method for producing a flexible display device of the present invention are described. The following modes may be appropriately combined without departing from the spirit of the present invention.

Preferably, the interfacial adhesion between the removal layer and the terminals is 0.05 N/25 mm to 0.5 N/25 mm. Adhesion in such a range makes it easy to separate part of the cut removal layer, allowing the terminals to be uncovered without being damaged. If the adhesion is less than 0.05 N/25 mm, the removal layer itself may naturally peel off in the removal layer formation or any of the following processes. If the adhesion is more than 0.5 N/25 mm, the separation may be difficult and may involve separation of the other layers (layer on the removal layer or any of the layers under the terminals), or an unseparated part may be left on the terminals. The adhesion can be measured by a test such as 90° peel test on glass. The device to measure the adhesion can be, for example, an autograph device from Shimadzu Corporation.

Preferably, the depth not deeper than the interface with the terminals is a depth that is 50% to 90% of the thickness of the removal layer on the terminals. Thereby, part of the cut removal layer can be easily separated, and the terminals can be uncovered without being damaged. The greater the depth to which the removal layer is cut, the easier it is to separate the part of the cut removal layer. If the depth to which the removal layer is cut is less than 50% of the thickness of the removal layer on the terminals, it may be difficult to separate the part of the cut removal layer. If the depth to which the removal layer is cut is more than 90% of the thickness of the removal layer on the terminals, the terminals may be damaged during the cutting.

Preferably, the conductive line includes a portion constituting a thin-film transistor element, and the thin-film transistor element is provided with a semiconductor layer including an oxide semiconductor. The treatment temperature for oxide semiconductors is usually lower than that for low-temperature polysilicon. Accordingly, in consideration of the heat resistance of the other components formed before the semiconductor layer, a flexible display device can be more suitably produced through formation of a semiconductor layer including an oxide semiconductor.

Oxide semiconductors have an advantage that they have higher mobility and smaller property variation than amorphous silicon. Hence, thin-film transistor elements containing an oxide semiconductor can be driven at a higher speed, have a higher driving frequency, and occupy a smaller proportion of one pixel, than thin-film transistor elements containing amorphous silicon. The thin-film transistor elements containing an oxide semiconductor are therefore suitable for driving of next-generation display devices with higher definition. Also, since oxide semiconductor films are formed by a more simple process than polycrystalline silicon films, the oxide semiconductor films have an advantage that they can be applied to devices requiring a large area.

Examples of the oxide semiconductors include compounds (In—Ga—Zn—O) made of indium (In), gallium (Ga), zinc (Zn), and oxygen (O), compounds (In-Tin-Zn—O) made of indium (In), tin (Tin), zinc (Zn), and oxygen (O), and compounds (In—Al—Zn—O) made of indium (In), aluminum (Al), zinc (Zn), and oxygen (O).

In the above step (2), a layer having the same composition as the removal layer may be placed in the display region, with a space from the removal layer. This method eliminates the need for adding a step only for forming the removal layer, increasing the production efficiency.

Examples of the flexible display device include those including an organic electroluminescent element. In this case, the mode in which the layer having the same composition as the removal layer is placed with a space from the removal layer is, for example, [1] a mode in which the flexible display device includes, in the display region, an organic electroluminescent element provided with a first electrode electrically connected to the conductive line, a second electrode, and an organic electroluminescent layer disposed between the first electrode and the second electrode, the layer having the same composition as the removal layer is at least part of a sealing film that covers the organic electroluminescent elements, and the at least part of the sealing film is formed together with the removal layer in step (2); or [2] a mode in which the flexible display device includes, in the display region, an organic electroluminescent element provided with a first electrode electrically connected to the conductive line, a second electrode, and an organic electroluminescent layer disposed between the first electrode and the second electrode, the layer having the same composition as the removal layer is the organic electroluminescent layer, and the organic electroluminescent layer is formed together with the removal layer in step (2).

Herein, the expression that "a specific layer is formed together with the removal layer" means that, for example, films are formed simultaneously by a common device and the films are simultaneously patterned with a common mask.

In the above step (2), a layer having a different composition from the removal layer may be placed in the display region, with a space from the removal layer. Specific examples thereof include a mode in which the flexible display device further includes, in the display region, an organic electroluminescent element provided with a first electrode electrically connected to the conductive line, a second electrode, and an organic electroluminescent layer disposed between the first electrode and the second electrode, and the removal layer is a film including a self-adsorption layer. In this case, the step of forming a sealing film to cover the organic electroluminescent element may be performed between steps (1) and (2) or between steps (2) and (3). That is, a sealing film may be formed to cover the organic electroluminescent element between steps (1) and (2), or a sealing film may be formed to cover the organic electroluminescent element between steps (2) and (3). These steps enable suitable production of a flexible display device including an organic electroluminescent element.

The sealing film may be an inorganic film, a laminate of inorganic films, or a laminate of inorganic film(s) and organic film(s). Since inorganic films are highly resistant to moisture, an inorganic film when used as a sealing film effectively prevents moisture-caused degradation of the properties of the organic electroluminescent element. Also, since an organic film can easily be made into a thick film, an organic film when used as a sealing film can cover foreign substances to sufficiently prevent the foreign substances from affecting the display qualities.

Examples of the flexible display device include those provided with a liquid crystal layer. Examples of the case in which the layer having the same composition as the removal layer is placed with a space from the removal layer include a mode in which the flexible display device includes a pixel electrode electrically connected to the conductive line, and an interlayer film disposed between the conductive line and the pixel electrode, in the display region on the main surface of the first flexible base material or of the temporary supporting substrate, the layer having the same composition as the removal layer is the interlayer film, and the interlayer film is formed together with the removal layer in step (2). Thereby, a flexible display device including a liquid crystal layer can be suitably produced.

Next, preferred modes of the flexible display device of the present invention are described. The following modes may be appropriately combined without departing from the spirit of the present invention. Here, the same points as in the above-described preferred modes of the method for producing a flexible display device of the present invention are not described.

Preferably, the interfacial adhesion between the removal layer and the terminals is preferably 0.05 N/25 mm to 0.5 N/25 mm.

Preferably, the conductive line includes a portion constituting a thin-film transistor element, and the thin-film transistor element is provided with a semiconductor layer including an oxide semiconductor.

The flexible display device may be one in which a layer having the same composition as the removal layer is placed in the display region, and the removal layer and the layer having the same composition as the removal layer are arranged with a space from each other.

Examples of the flexible display device include those including an organic electroluminescent element, such as a flexible display device in which the display element is an organic electroluminescent element provided with a first electrode electrically connected to the conductive line, a second electrode, and an organic electroluminescent layer disposed between the first electrode and the second electrode. In this case, examples of the mode in which the layer having the same composition as the removal layer is placed with a space from the removal layer include [1] a mode in which the layer having the same composition as the removal layer is at least part of a sealing film placed to cover the organic electroluminescent element; and [2] a mode in which the layer having the same composition as the removal layer is the organic electroluminescent layer.

The sealing film may be an inorganic film, a laminate of inorganic films, or a laminate of inorganic film(s) and organic film(s).

The flexible display device may be one in which a layer having a different composition from the removal layer is placed in the display region, and the removal layer and the layer having a different composition from the removal layer are arranged with a space from each other. Specific examples thereof include a mode in which the display element is an organic electroluminescent element provided with a first electrode electrically connected to the conductive line, a second electrode, and an organic electroluminescent layer disposed between the first electrode and the second electrode, and the removal layer is a film including a self-adsorption layer.

Examples of the flexible display device include those including a liquid crystal layer. In this case, examples of the case in which a layer having the same composition as the removal layer is placed with a space from the removal layer include a mode in which the display element is a liquid crystal layer, the flexible display device further includes a pixel electrode electrically connected to the conductive line, and an interlayer film disposed between the conductive line and the pixel electrode, and the layer having the same composition as the removal layer is the interlayer film.

The flexible display device may include a second adhesive layer, a polyimide layer, and a protective film sequentially arranged between the first flexible base material and the conductive line.

REFERENCE SIGNS LIST 1a, 1b, 1c, 1d, 1e: Flexible display device
2a, 2b: Flexible base material
3: Terminal
4a, 4b: Adhesive layer
5: Conductive line
6: Organic electroluminescent element
7: Polyimide layer
8: Protective film
9a, 9b, 9b', 9c: Sealing film
10: Anisotropic conductive film
11: Flexible printed circuit board
12a: Insulating film
12b, 12b': Interlayer film
13a, 13b: Electrode
14, 14': Organic electroluminescent layer
15: Edge cover
16: Glass substrate
17: Heat-absorbing layer
18: Film
19: Self-adsorption layer
20: Pixel electrode
21: Color filter layer
22: Sealing material
23: Liquid crystal layer
AR1: Display region
AR2: Edge region

The invention claimed is:

1. A method for producing a flexible display device, the flexible display device including a first flexible base material and a second flexible base material which are attached to each other by a first adhesive layer, the method comprising the following steps (1) to (4) in the order given:
   (1) forming a conductive line in a display region on a main surface of the first flexible base material or of a temporary supporting substrate, and forming terminals that are led out from the conductive line into an edge region on the main surface;
   (2) forming a removal layer to directly cover the terminals;
   (3) sequentially arranging multiple layers including the first adhesive layer and the second flexible base material in the display region and in the edge region, with higher interfacial adhesions present between the removal layer and the second flexible base material than the interfacial adhesion between the removal layer and the terminals; and
   (4) exposing at least part of each terminal by cutting the multiple layers and making a cut in the removal layer to a depth not deeper than the interface with the terminals in the display region side of the edge region, and separating the part of the cut removal layer on the side opposite to the display region to remove the parts of the cut multiple layers and removal layer on the side opposite to the display region.

2. The method for producing a flexible display device according to claim 1, wherein the depth not deeper than the interface with the terminals is a depth that is 50% to 90% of the thickness of the removal layer on the terminals.

3. The method for producing a flexible display device according to claim 1, wherein in step (2), a layer having the same composition as the removal layer is placed in the display region, with a space from the removal layer.

4. The method for producing a flexible display device according to claim 3, wherein
   the flexible display device includes, in the display region, an organic electroluminescent element provided with a first electrode electrically connected to the conductive line, a second electrode, and an organic electroluminescent layer disposed between the first electrode and the second electrode,
   the layer having the same composition as the removal layer is at least part of a sealing film that covers the organic electroluminescent element, and
   the at least part of the sealing film is formed together with the removal layer in step (2).

5. The method for producing a flexible display device according to claim 3, wherein
   the flexible display device includes, in the display region, an organic electroluminescent element provided with a first electrode electrically connected to the conductive line, a second electrode, and an organic electroluminescent layer disposed between the first electrode and the second electrode,
   the layer having the same composition as the removal layer is the organic electroluminescent layer, and
   the organic electroluminescent layer is formed together with the removal layer in step (2).

6. The method for producing a flexible display device according to claim 1, wherein
   the flexible display device further includes, in the display region, an organic electroluminescent element provided with a first electrode electrically connected to the conductive line, a second electrode, and an organic electroluminescent layer disposed between the first electrode and the second electrode, and
   the removal layer is a film including a self-adsorption layer.

7. The method for producing a flexible display device according to claim 3, wherein
   the flexible display device includes a liquid crystal layer, a pixel electrode electrically connected to the conductive line, and an interlayer film disposed between the conductive line and the pixel electrode, in the display region on the main surface of the first flexible base material or of the temporary supporting substrate,
   the layer having the same composition as the removal layer is the interlayer film, and
   the interlayer film is formed together with the removal layer in step (2).

8. A flexible display device, comprising:

a first flexible base material;

a conductive line and a display element placed in a display region on a main surface of the first flexible base material;

terminals that are arranged in an edge region on the main surface of the first flexible base material and are led out from the conductive line;

a first adhesive layer placed at least in the display region; and a second flexible base material attached to at least the display region by the first adhesive layer, wherein the display element is an organic electroluminescent element including a first electrode electrically connected to the conductive line, a second electrode, and an organic electroluminescent layer located between the first electrode and the second electrode, the terminals are each partly covered with a removal layer on the display region side, the removal layer is at least a portion of a sealing film that covers the organic electroluminescent element, the organic electroluminescent layer, or a film including a self-adsorption layer, the sealing film is a laminate of an inorganic film and an organic film, and an interfacial adhesion between the removal layer and the terminals is a lowest among interfacial adhesions present between the removal layer and the second flexible base material.

9. The flexible display device according to claim 8, wherein the interfacial adhesion between the removal layer and the terminals is 0.05 N/25 mm to 0.5 N/25 mm.

10. The flexible display device according to claim 8, wherein a layer having the same composition as the removal layer is placed in the display region, and the removal layer and the layer having the same composition as the removal layer are arranged with a space from each other.

11. A flexible display device, comprising:

a first flexible base material;

a conductive line and a display element placed in a display region on a main surface of the first flexible base material;

terminals that are arranged in an edge region on the main surface of the first flexible base material and are led out from the conductive line;

a first adhesive layer placed at least in the display region;

a second flexible base material attached to at least the display region by the first adhesive layer;

a pixel electrode electrically connected to the conductive line; and an interlayer film located between the conductive line and the pixel electrode, wherein the display element is a liquid crystal layer, the terminals are each partly covered with a removal layer on the display region side, the interlayer film has a same composition as the removal layer and is in the display region, the removal layer and the interlayer film are spaced apart from each other, and an interfacial adhesion between the removal layer and the terminals is a lowest among interfacial adhesions present between the removal layer and the second flexible base material.

12. The flexible display device according to claim 11, wherein the interfacial adhesion between the removal layer and the terminals is 0.05 N/25 mm to 0.5 N/25 mm.

* * * * *